(12) United States Patent
Noda

(10) Patent No.: US 8,151,451 B2
(45) Date of Patent: Apr. 10, 2012

(54) ELECTRONIC COMPONENT BONDING MACHINE

(75) Inventor: Kazuhiko Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 363 days.

(21) Appl. No.: 12/496,850

(22) Filed: Jul. 2, 2009

(65) Prior Publication Data
US 2010/0000081 A1 Jan. 7, 2010

(30) Foreign Application Priority Data
Jul. 7, 2008 (JP) ................................ 2008-176546

(51) Int. Cl.
*H05K 13/04* (2006.01)
(52) U.S. Cl. ................. 29/739; 29/740; 29/741; 29/743
(58) Field of Classification Search ............ 29/739–741, 29/743
See application file for complete search history.

(56) References Cited

U.S. PATENT DOCUMENTS 5,203,061 A * 4/1993 Hamada ........................ 29/33 M
5,839,187 A * 11/1998 Sato et al. ........................ 29/743
2006/0185157 A1* 8/2006 Shida et al. ..................... 29/740

FOREIGN PATENT DOCUMENTS

| JP | 11-274240 A | 10/1999 |
| JP | 2001-060795 A | 3/2001 |
| JP | 2005-123638 A | 5/2005 |

* cited by examiner

*Primary Examiner* — Livius R Cazan
(74) *Attorney, Agent, or Firm* — Pearne & Gordon LLP

(57) ABSTRACT

In a construction in which the intermediate stage 5 is interposed between the substrate positioning stage 4 and the electronic component supply stage 3; and in which it is possible to select either a mode of the bonding head 10A transferring to the substrate positioning stage 4 the electronic component P taken out of the electronic component supply stage 3 by the pickup head 6 and mounted on the intermediate stage 5 or a mode for transporting the electronic components, which has been taken directly out of the electronic component supply stage 3, to the substrate positioning stage 4 by means of the bonding head 10A, the pickup head moving mechanism 7 for moving the pickup head 6 is coupled in a suspended manner to the lower surface of the beam member 8b of the gantry 8 positioned at the end of the base 2, and a space S that allows entry of a portion of the electronic component supply stage 3 is assured at a position beneath the pickup head moving mechanism 7.

4 Claims, 16 Drawing Sheets

DETAILED SECTION A

ELECTRONIC COMPONENT BONDING MACHINE

BACKGROUND OF THE INVENTION

1. Field of the Invention

The present invention relates to an electronic component bonding machine that takes an electronic component, such as a semiconductor chip, out of an electronic component supply stage and that bonds the thus-extracted electronic component to a substrate.

2. Description of the Related Art

An electronic component, such as a semiconductor chip, is taken out of an electronic component supply stage and bonded to a lead-frame, a resin substrate, and the like. A form of bonding of such an electronic component is broadly divided, according to a mount position of an electronic component, into face-up bonding in which an electronic component is bonded while its active face is upwardly oriented and so-called face-down bonding in which the electronic component is bonded while its active face is downwardly oriented. When an electronic component to be bonded is a semiconductor chip, semiconductor chips cut out of a semiconductor wafer are picked up piece by piece.

Semiconductor chips in the form of a wafer are held on a wafer sheet in a face-up position in which active faces are upwardly oriented. Therefore, in order to bond the semiconductor chips to corresponding substrates in a face-down position, the semiconductor chips taken out of the semiconductor waver must be inverted upside down on an electronic component supply stage. For these reasons, a bonder having a component inversion mechanism for inverting a taken-out semiconductor chip upside down has hitherto been known as a bonder that bonds these semiconductor chips in a face-down position (see Patent Documents 1 and 2).

In an embodiment described in connection with Patent Document 1, in order to enhance an accuracy of implementation position, a semiconductor chip taken out of an electronic component supply stage is temporarily placed on a mount section to undergo deviation correction, and the chip is held by a mount head and implemented on a substrate. In an embodiment described in connection with Patent Document 2, with a view toward preventing deterioration of working efficiency, which would otherwise be caused when operation of an unloading head for taking an electronic component out of a component supply section interferes with operation of a mount head that implements an electronic component on a substrate, a transfer head is interposed between the unloading head and the mount head.

With the objective of realizing a facility exhibiting greater general versatility, a bonder constructed so as to enable a single bonder to perform both face-up bonding and face-down bonding has also been proposed (see; for instance, Patent Document 3). In an embodiment described in connection with Patent Document 3, two holding tables, one for holding an electronic component in a face-up position at a component supply section and the other for holding an electronic component in a face-down position at the component supply section, are provided.

Patent Document 1: JP-A-11-274240
Patent Document 2: JP-A-2001-60795
Patent Document 3: JP-A-2005-123638

Incidentally, in a current electronic equipment manufacturing field, both enhancement of general versatility of a production facility intended to enable handling of a wide range of component types, including high-performance electronic components requiring a high degree of component implementation accuracy, and a reduction in facility's footprint for enhancing area productivity have come to be sought in order to achieve a further increase in productivity and quality. However, under the prior art technique described in connection with Patent Documents, it has been impossible to sufficiently fulfill such requests.

For instance, under the related-art technique described in connection with Patent Document 1, the degree of component implementation accuracy can be assured, but face-down bonding cannot be performed. A mount section for temporarily placing a semiconductor chip to correct deviation must additionally be provided, which poses difficulty in reducing a facility's foot print. Likewise, under the related-art technique described in connection with Patent Document 2, face-down bonding cannot be performed, and a transfer head for preventing occurrence of interference between operations of heads must additionally be provided, which also poses difficulty in reducing facility's footprint.

Under the related-art technique described in connection with Patent Document 3, two hold tables, one for holding an electronic component in a face-up position and the other for holding an electronic component in a face-down position, are provided. Therefore, it has likewise been difficult to curtail a facility's footprint. As mentioned above, the related-art electronic component bonders encounter a problem: namely, difficulty in enhancing general versatility by increasing the range of components that can be taken as production objects and increasing area productivity by curtailing a facility's footprint.

SUMMARY OF THE INVENTION

Accordingly, the present invention aims at providing an electronic component bonder capable of enhancing its general versatility and area productivity.

An electronic component bonder of the present invention is an electronic component bonder that bonds an electronic component taken out of an electronic component supply stage to a substrate positioned on a substrate positioning stage, the bonder comprising: a base on which the substrate positioning stage and the electronic component supply stage are arranged side by side in a first direction when viewed from above; a portal frame that is arranged at an edge of the base in a second direction orthogonal to the first direction, that has a horizontal portion whose lower surface is situated at a position higher than the substrate positioning stage and the electronic component supply stage, that extends in the first direction, and that is arranged while a front face of the horizontal portion is oriented toward a center of the base; a intermediate stage that is interposed between the substrate positioning stage and the electronic component supply stage and on which the electronic component taken out of the electronic component supply stage is to be mounted; a pickup head that picks up the electronic component from the electronic component supply stage and transfers the component to the intermediate stage; a pickup head moving mechanism that moves the pickup head between a position above the electronic component supply stage and a position above the intermediate stage and that causes the pickup head to advance or recede in the second direction; a bonding head that holds the electronic component on the electronic component supply stage or the electronic component transferred to the intermediate stage by the pickup head and that bonds the electronic component to the substrate positioned on the substrate positioning stage; and a bonding head moving mechanism that is arranged on a front face of the horizontal portion of the portal frame along the first direction and that moves the bonding head between a position above the electronic component supply stage or the intermediate stage and a position above the substrate positioning stage, wherein the pickup head moving mechanism is joined, in a suspended manner, to the lower surface of the horizontal portion of the portal frame, and a space that allows entry of a portion of the electronic component supply stage is assured at a position beneath the pickup head moving mechanism.

In a construction in which the intermediate stage is interposed between the substrate positioning stage and the electronic component supply stage; and in which it is possible to select either a mode of the bonding head transferring to the substrate positioning stage the electronic component taken out of the electronic component supply stage by the pickup head and mounted on the intermediate stage or a mode for conveying an electronic component taken directly out of an electronic component supply stage to a substrate positioning stage, the pickup head moving mechanism for moving the pickup head is coupled in a suspended manner to the lower surface of a horizontal portion of the portal frame positioned at the end of the base, and a space that allows entry of a portion of the electronic component supply stage is assured at a position beneath the pickup head moving mechanism. Versatility can be enhanced by making the bonding mode selectable, and area productivity can be enhanced by reducing facility's footprint.

DESCRIPTION OF THE PREFERRED EMBODIMENTS

Figure 1:
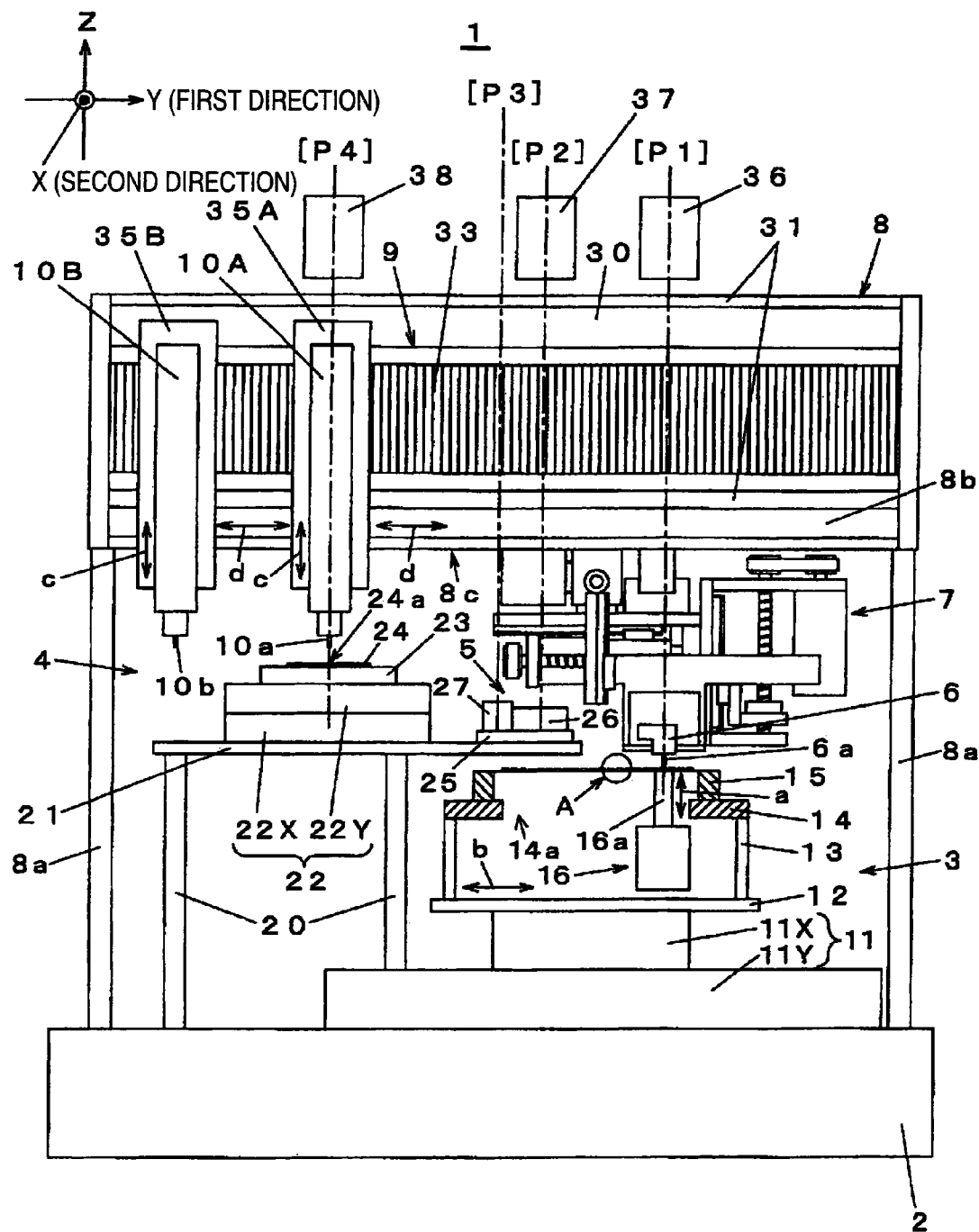
FIG. 1 is a front view of an electronic component bonder of an embodiment of the present invention.
Figure 2:
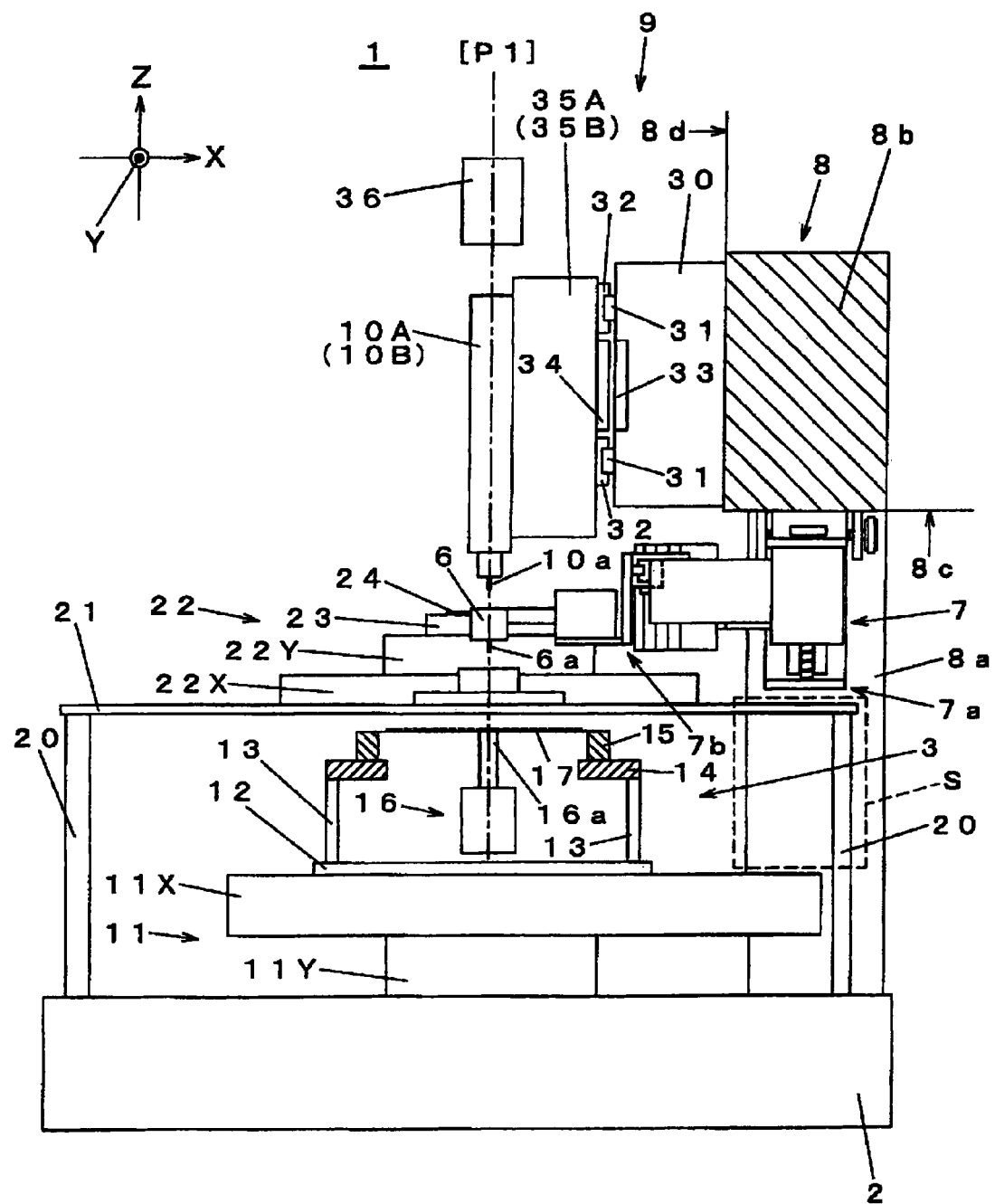
FIG. 2 is a side view of the electronic component bonder of the embodiment of the present invention.
Figure 3:
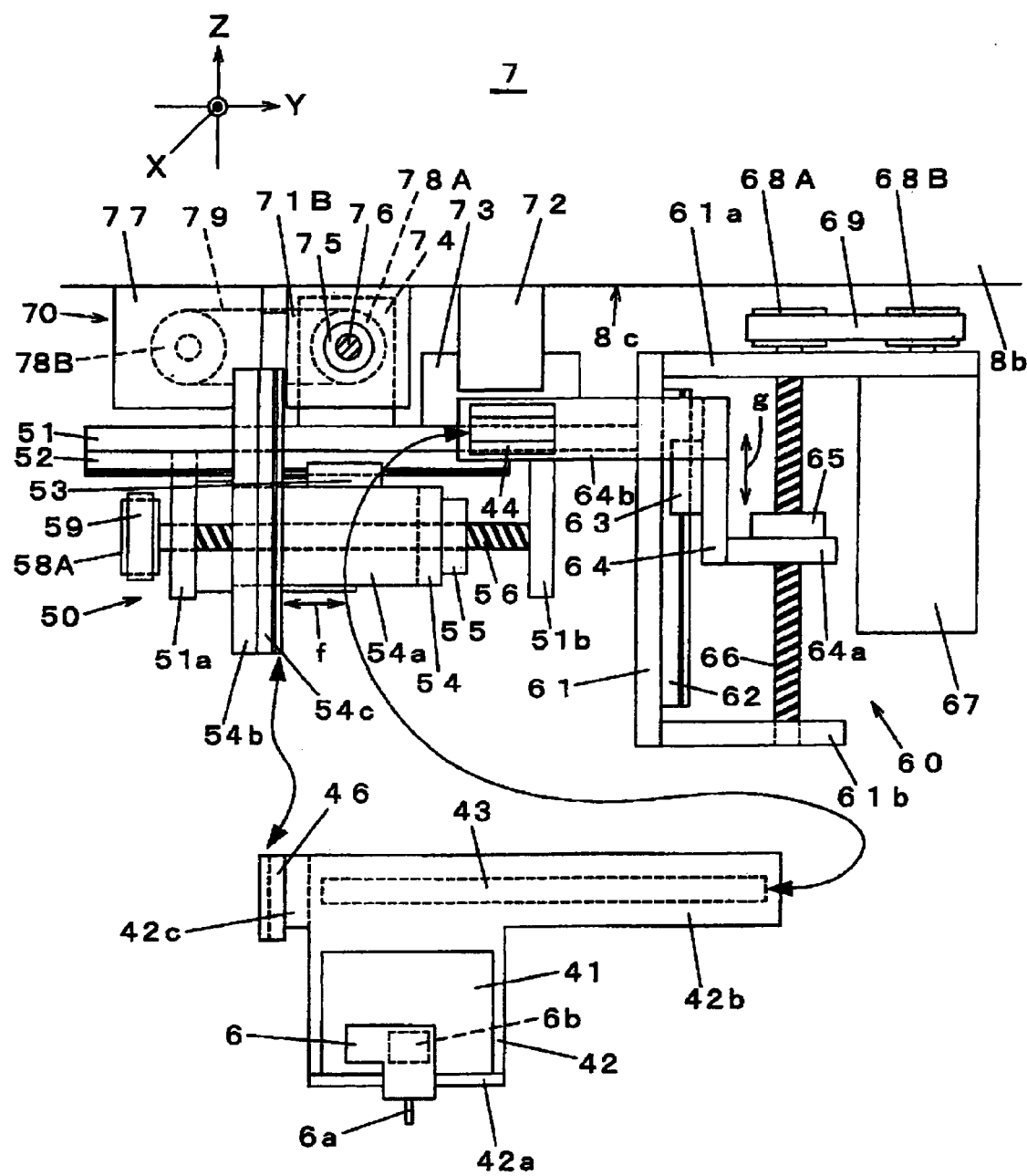
FIG. 3 is a structural descriptive view of a pickup head and a pickup head moving mechanism in the electronic component bonder of the embodiment of the present invention.
Figure 4:
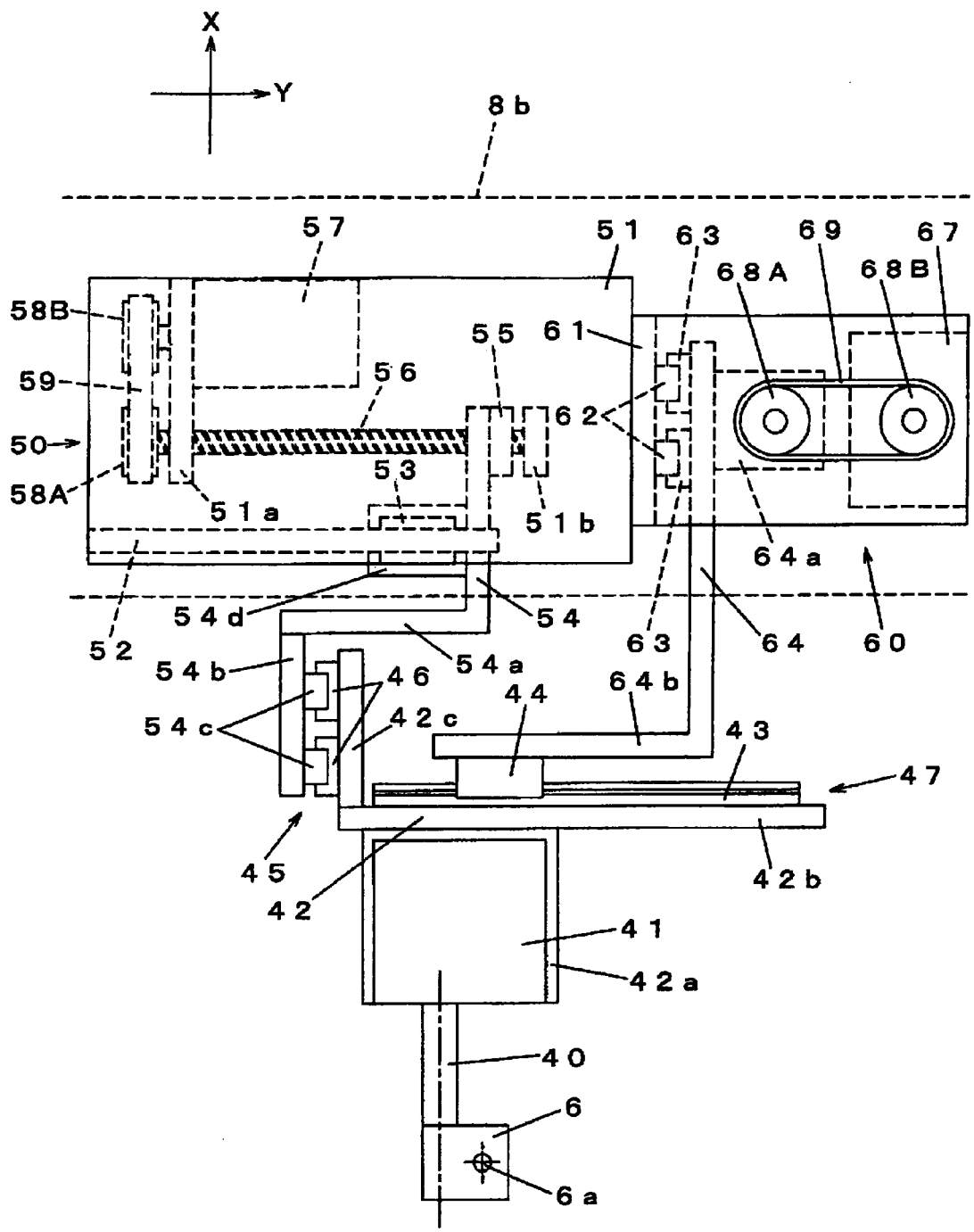
FIG. 4 is a structural descriptive view of a pickup head and a pickup head moving mechanism in the electronic component bonder of the embodiment of the present invention.
Figure 5:
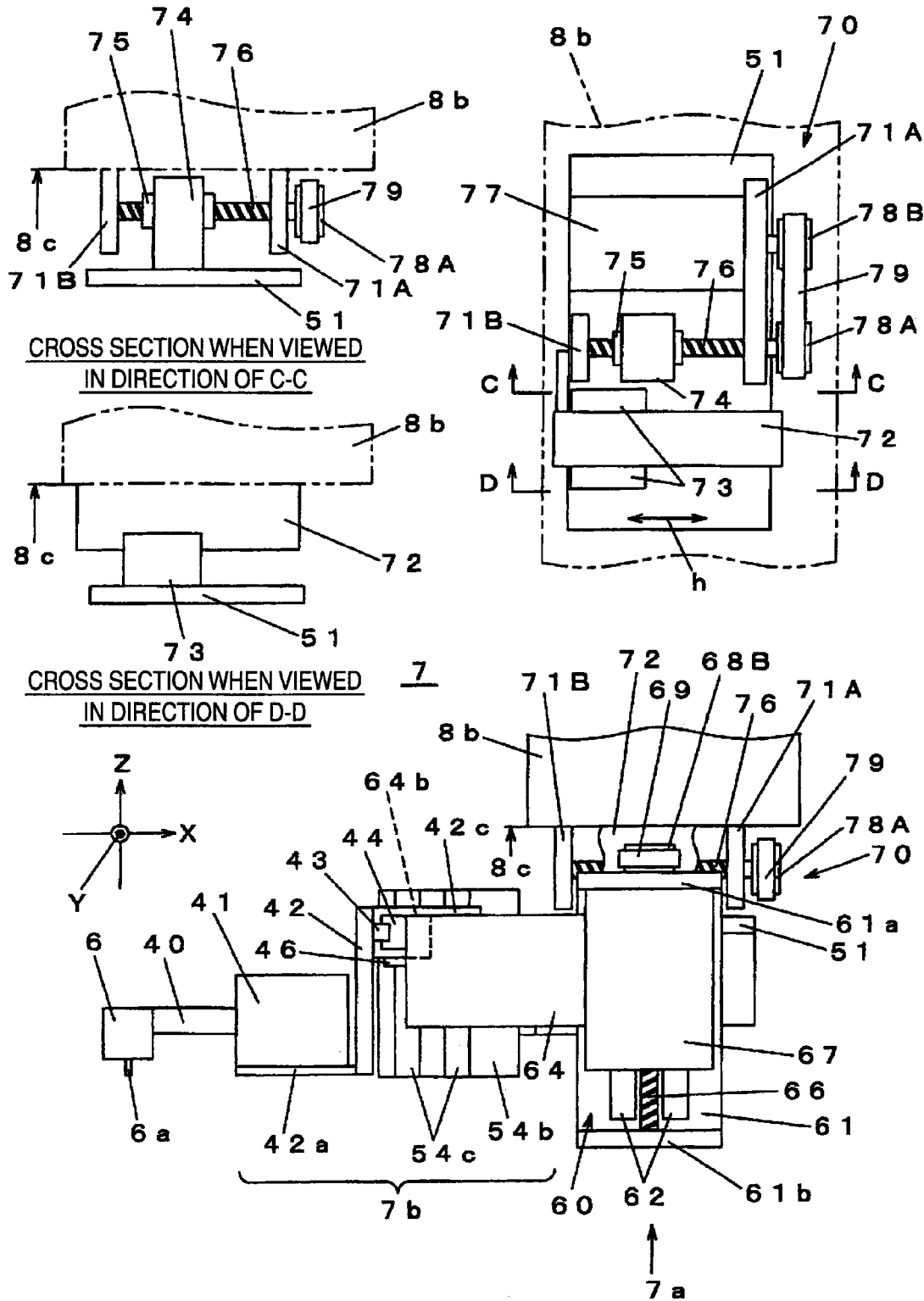
FIG. 5 is a structural descriptive view of a pickup head and a pickup head moving mechanism in the electronic component bonder of the embodiment of the present invention.
Figure 6:
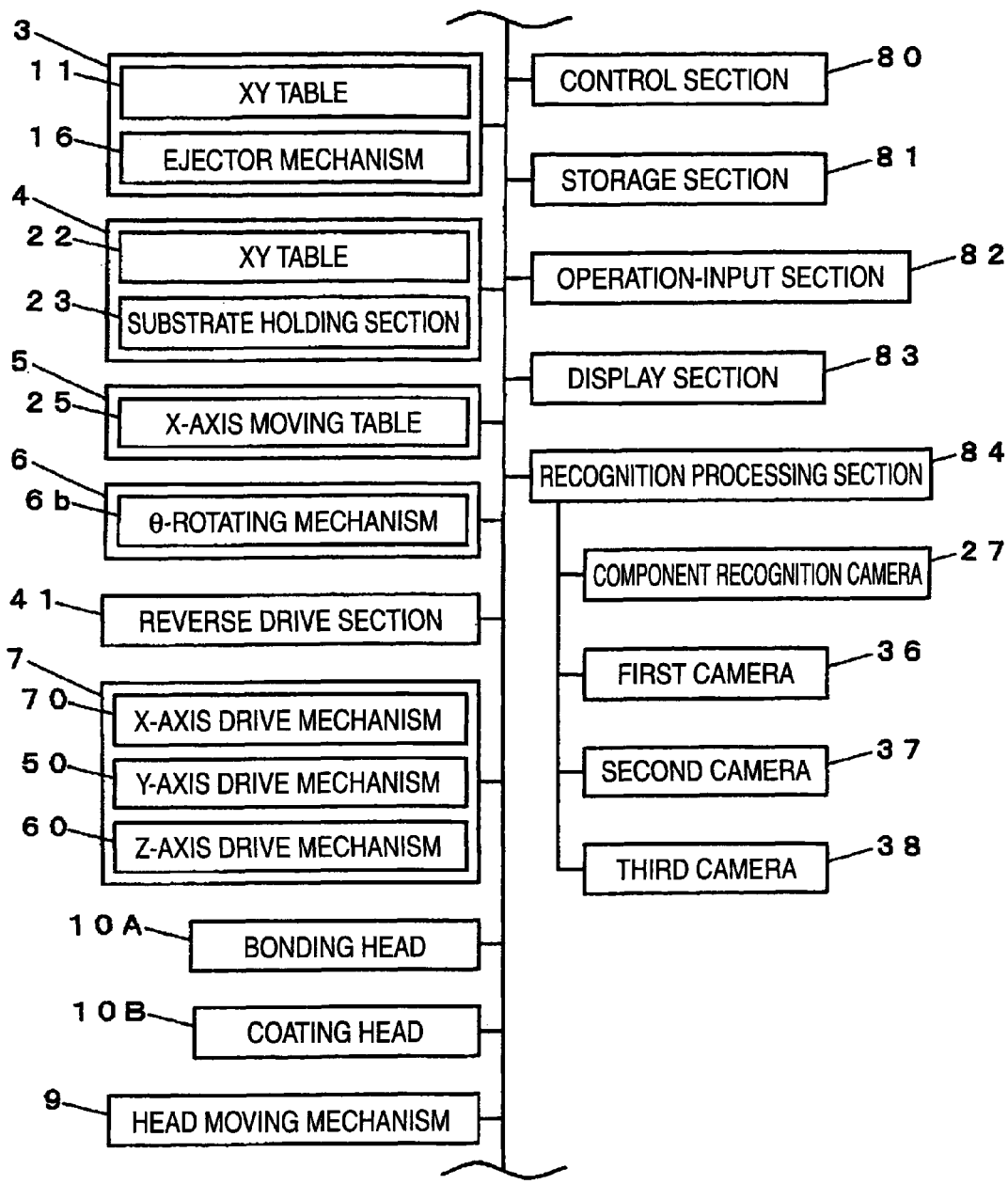
FIG. 6 is a block diagram showing a configuration of a control system of the electronic component bonder of the embodiment of the present invention.
Figure 7:
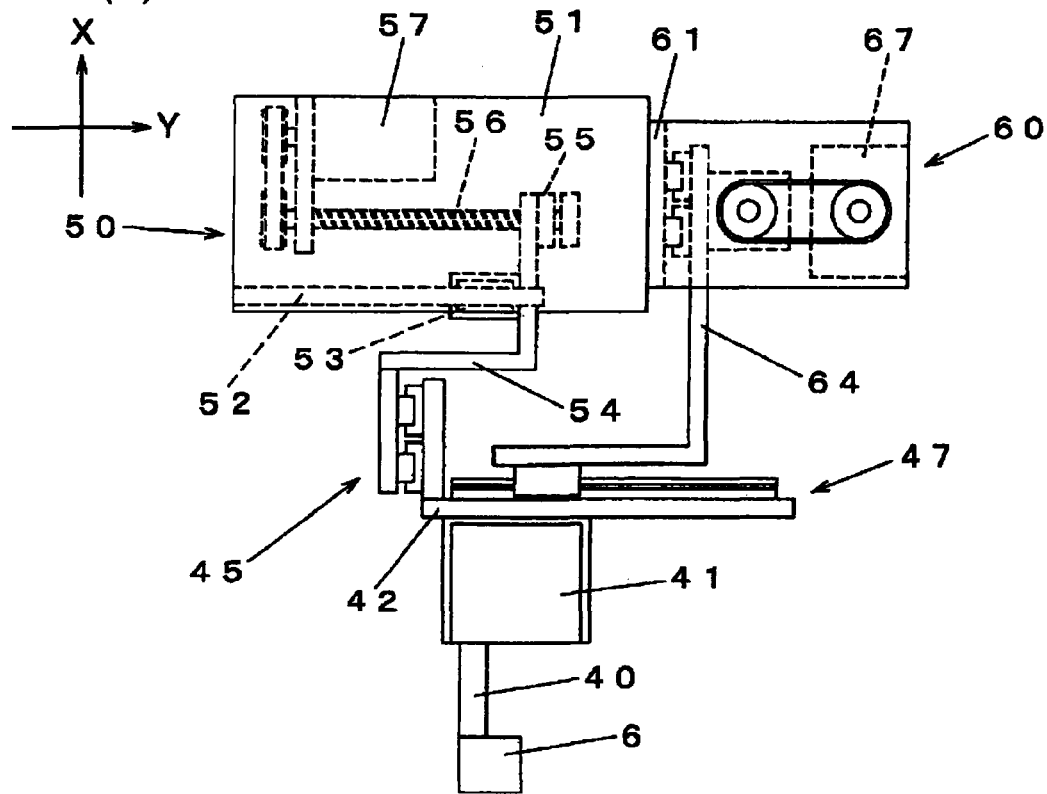
FIG. 7 is an operation descriptive view of the pickup head moving mechanism in the electronic component bonder of the embodiment of the present invention.
Figure 7:
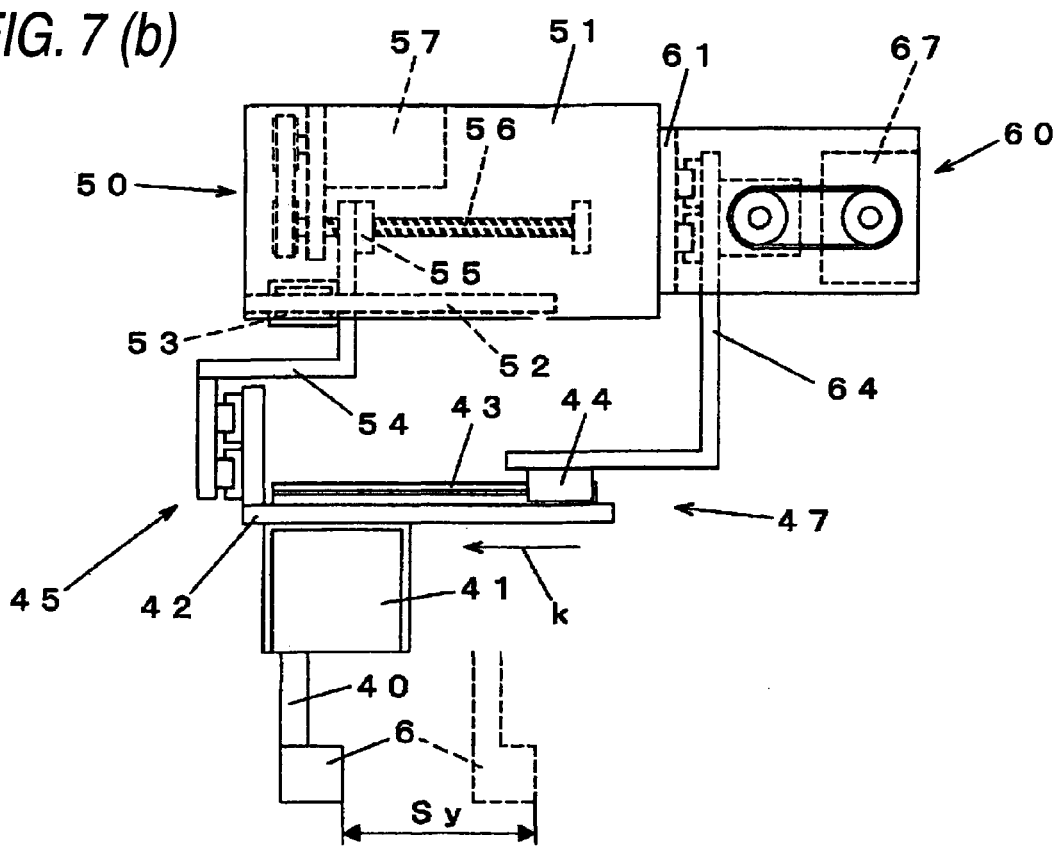
Figure 8:
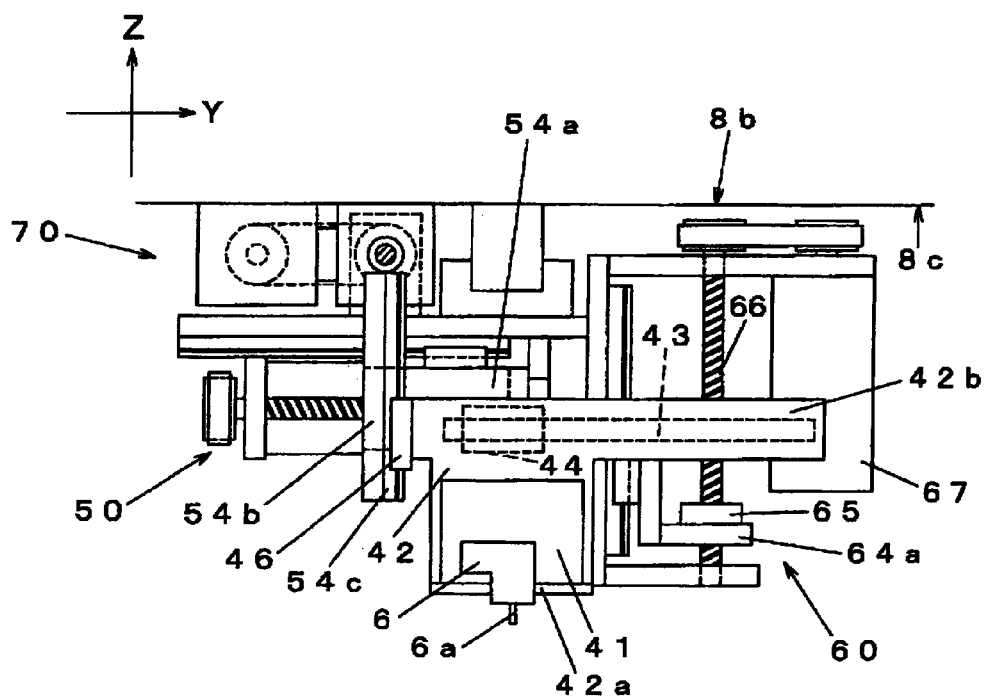
FIG. 8 is an operation descriptive view of the pickup head moving mechanism in the electronic component bonder of the embodiment of the present invention.
Figure 8:
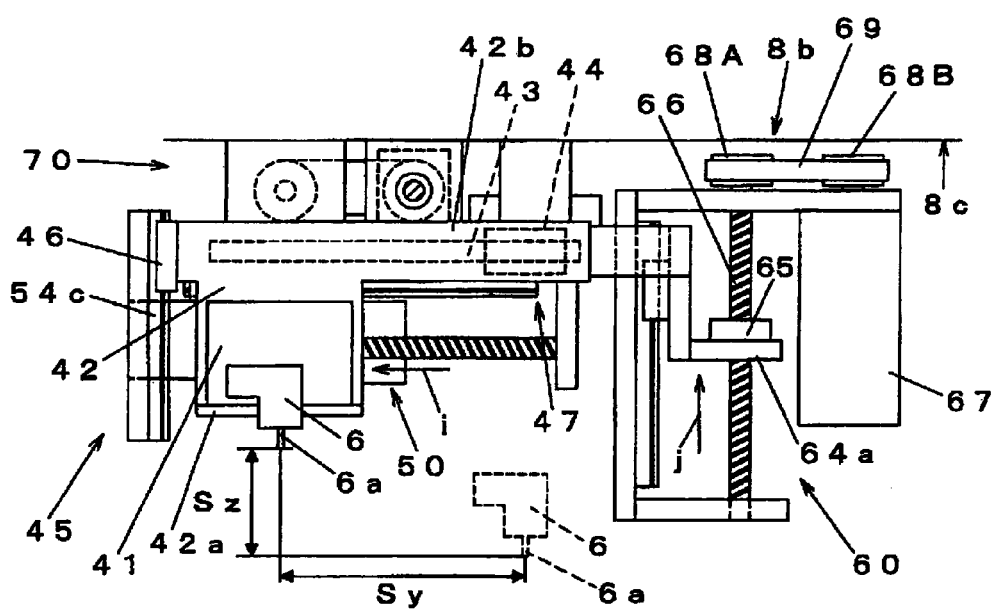
Figure 9:
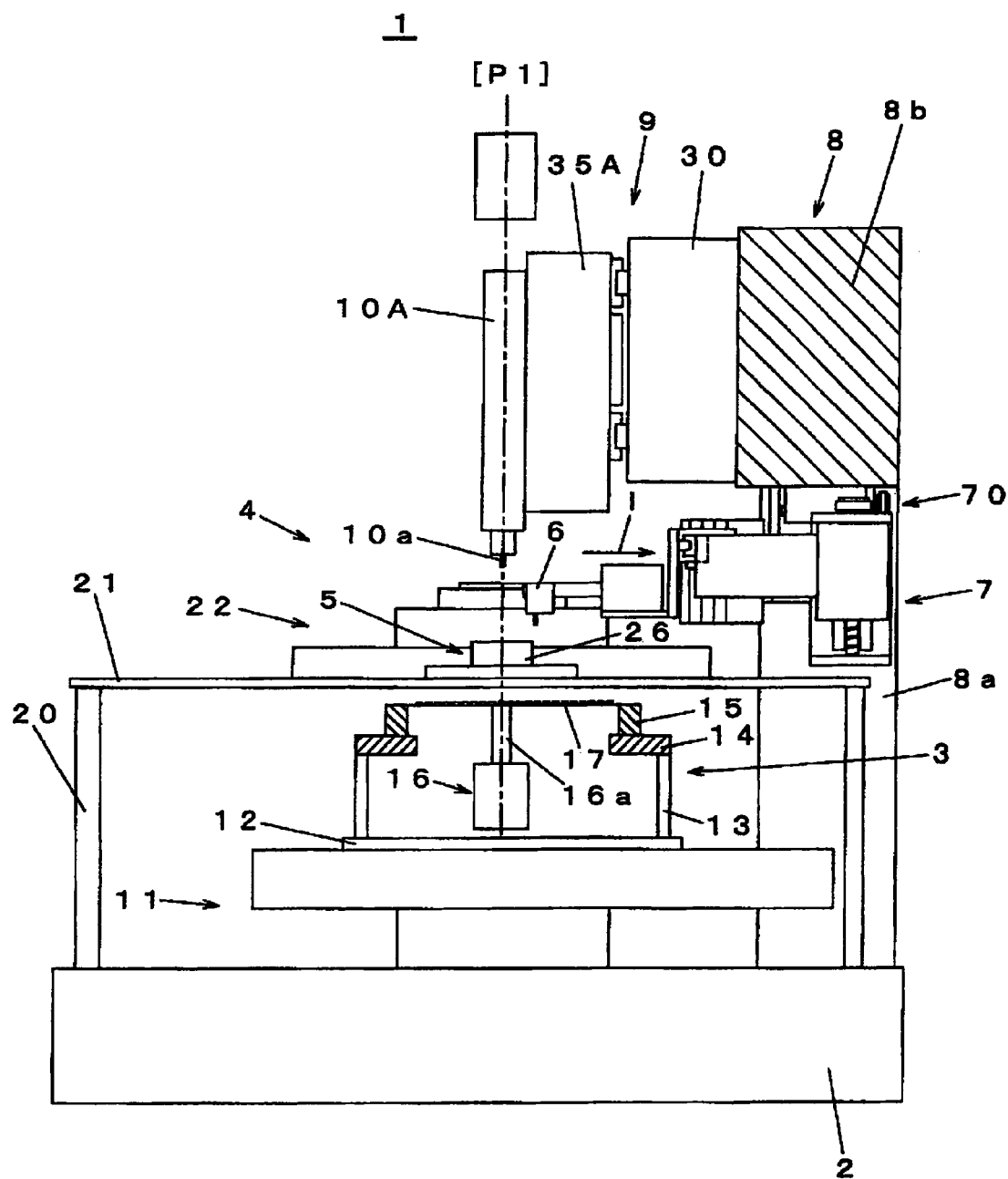
FIG. 9 is an operation descriptive view of the pickup head moving mechanism in the electronic component bonder of the embodiment of the present invention.
Figure 10:
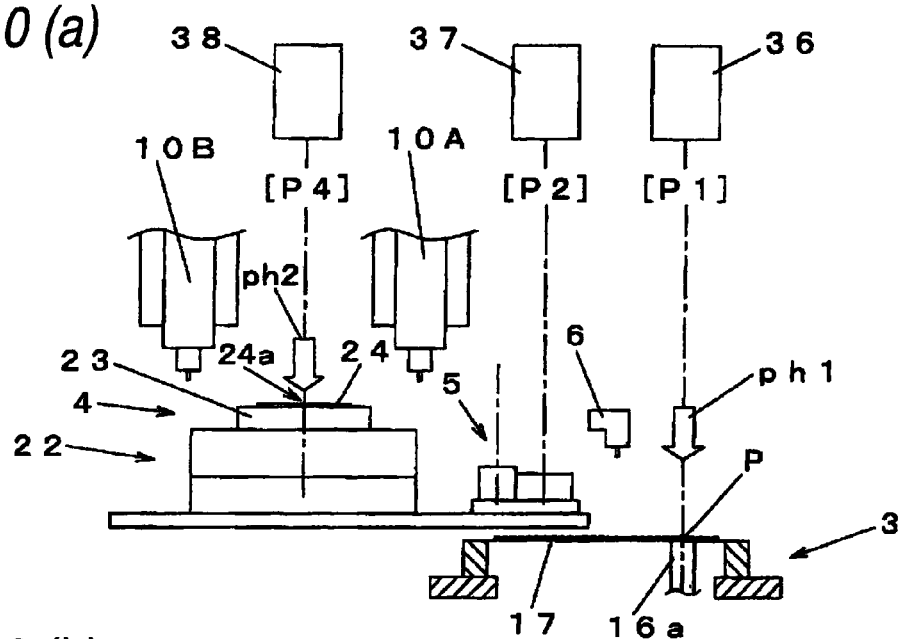
FIG. 10 is a process descriptive view of electronic component bonding operation of the electronic component bonder of the embodiment of the present invention.
Figure 10:
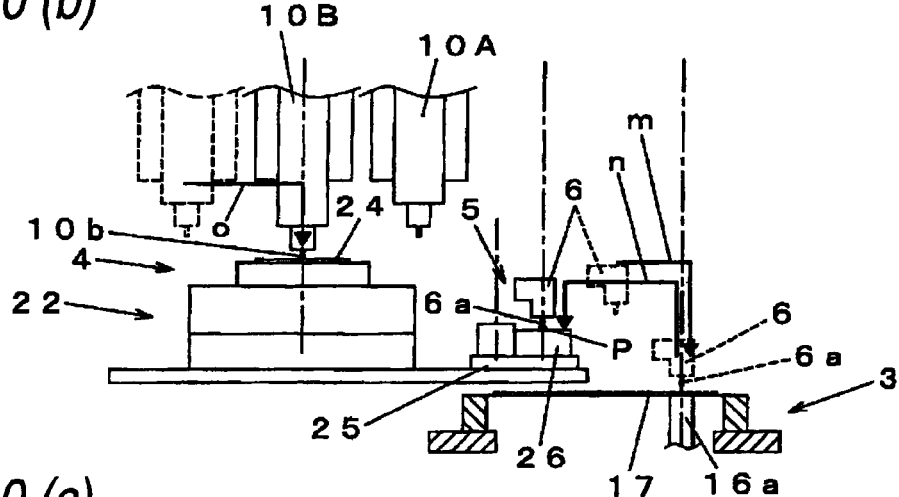
Figure 10:
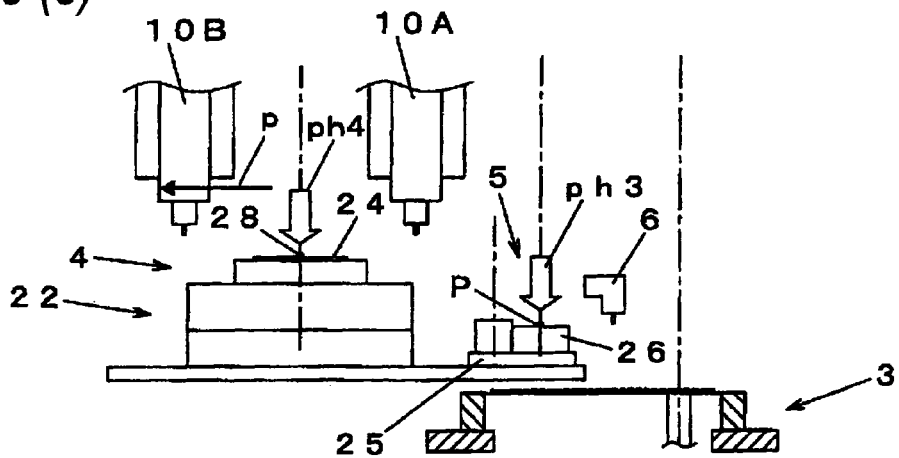
Figure 11:
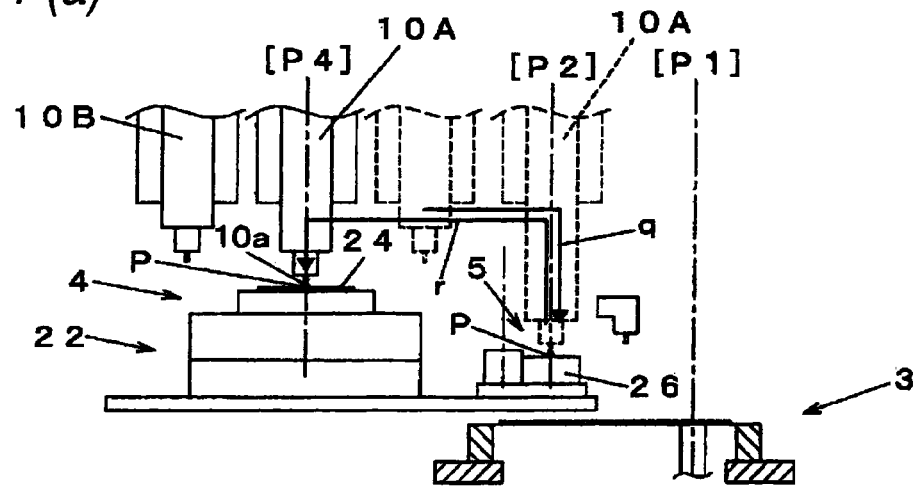
FIG. 11 is a process descriptive view of electronic component bonding operation of the electronic component bonder of the embodiment of the present invention.
Figure 11:
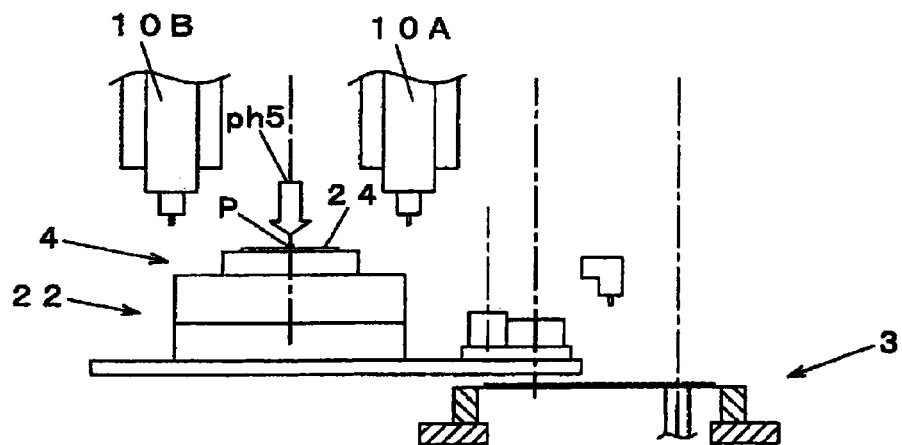
Figure 11:
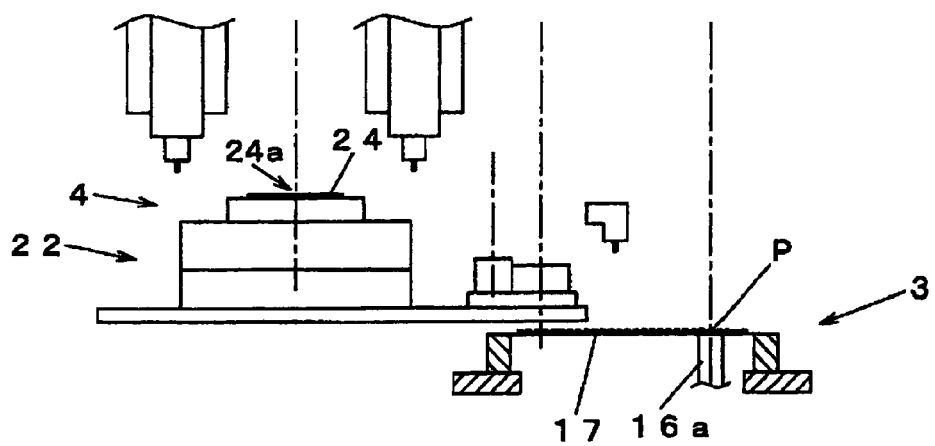
Figure 12:
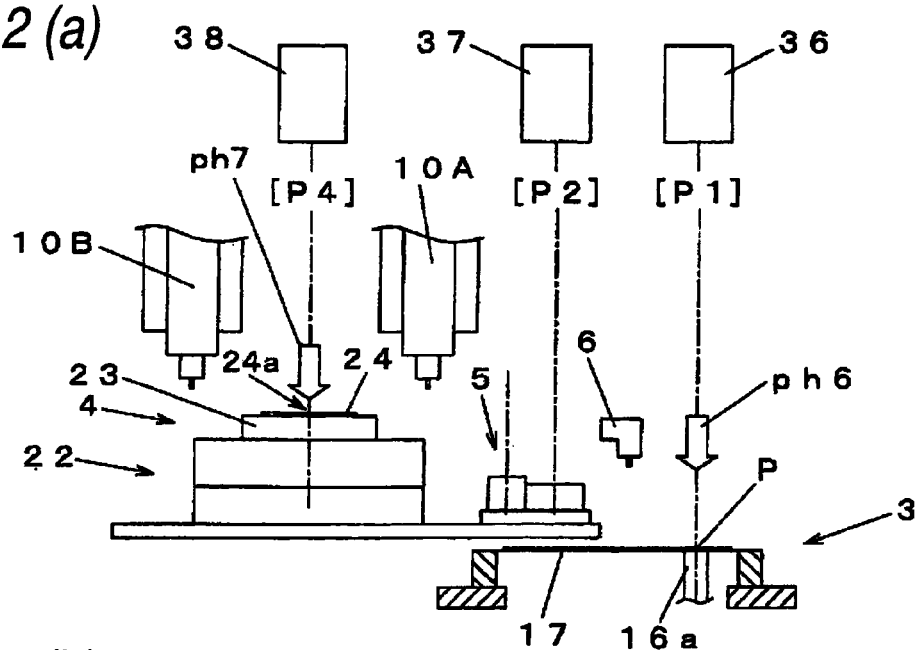
FIG. 12 is a process descriptive view of electronic component bonding operation of the electronic component bonder of the embodiment of the present invention.
Figure 12:
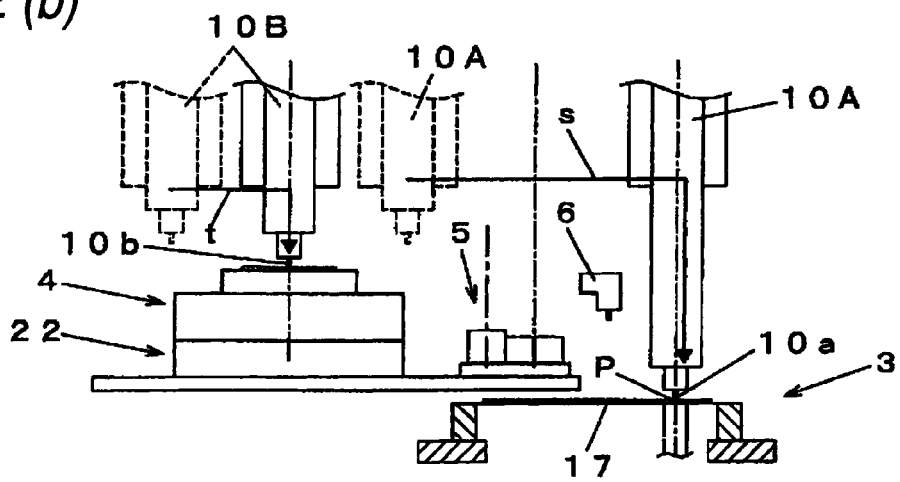
Figure 12:
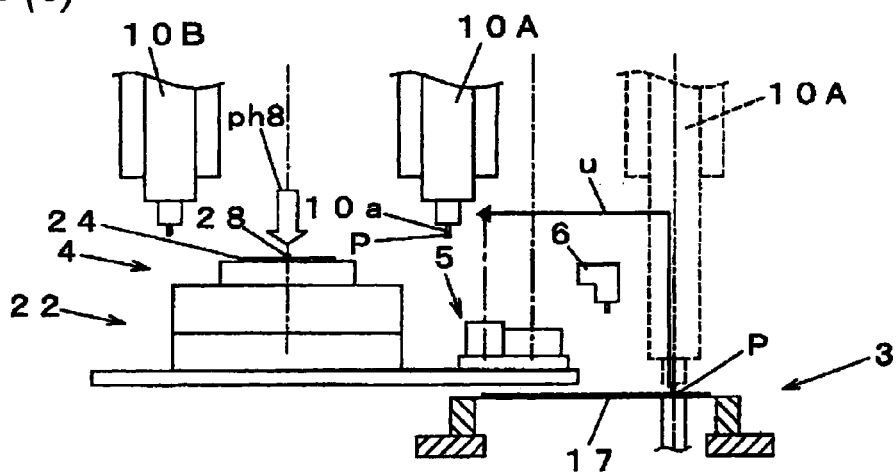
Figure 13:
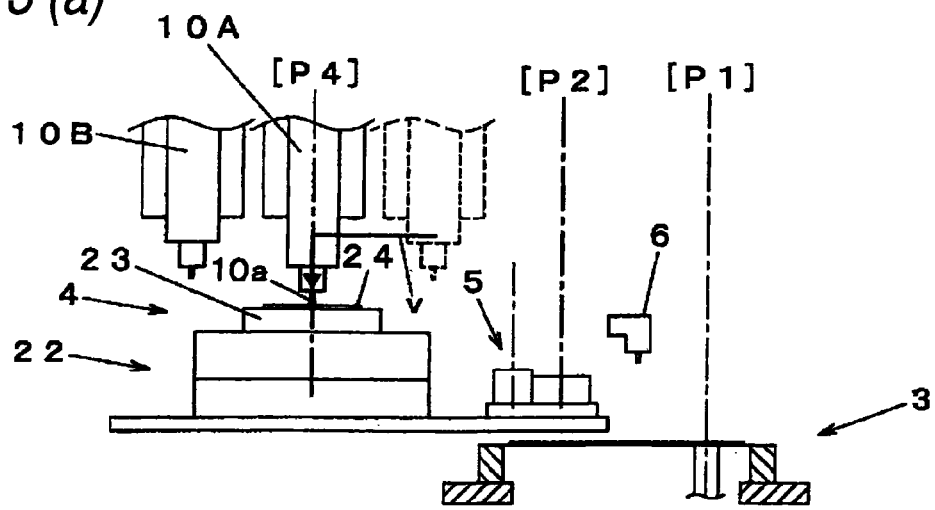
FIG. 13 is a process descriptive view of electronic component bonding operation of the electronic component bonder of the embodiment of the present invention.
Figure 13:
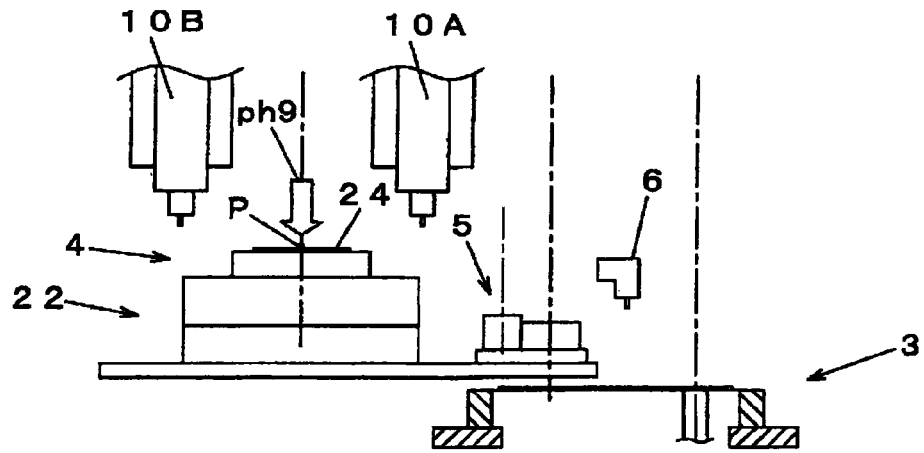
Figure 13:
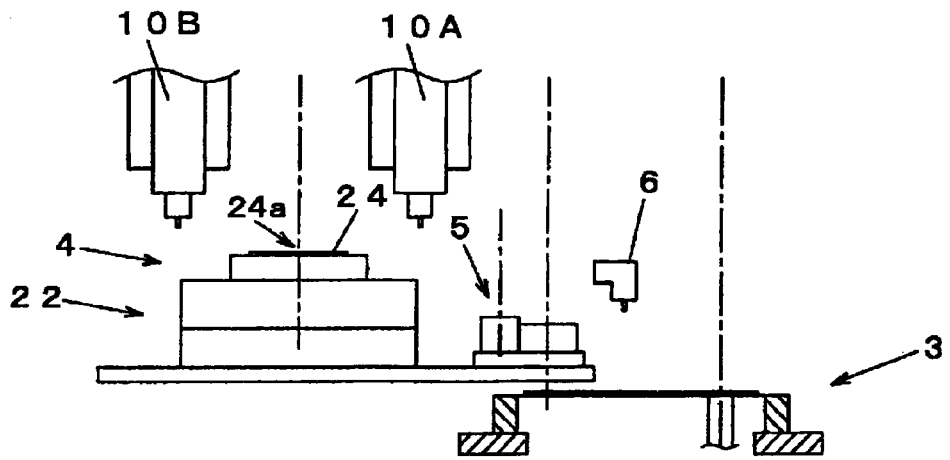
Figure 14:
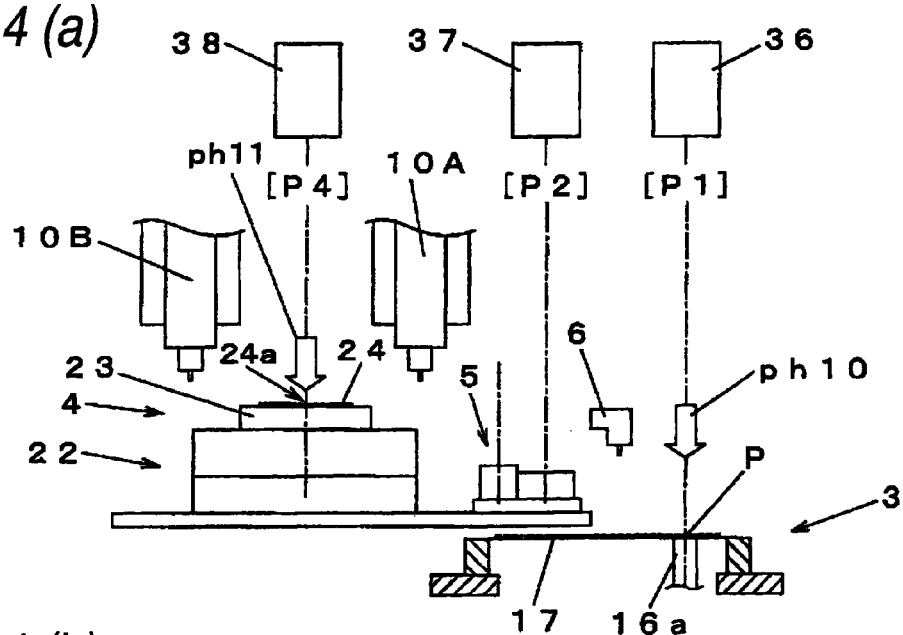
FIG. 14 is a process descriptive view of electronic component bonding operation of the electronic component bonder of the embodiment of the present invention.
Figure 14:
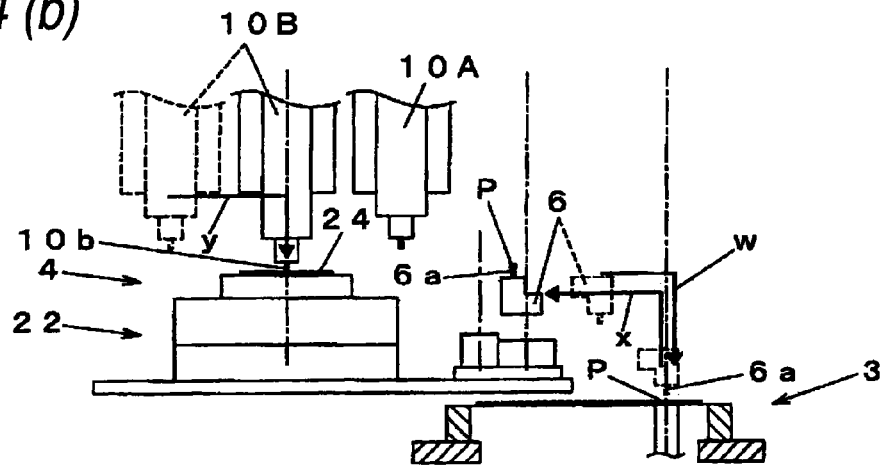
Figure 14:
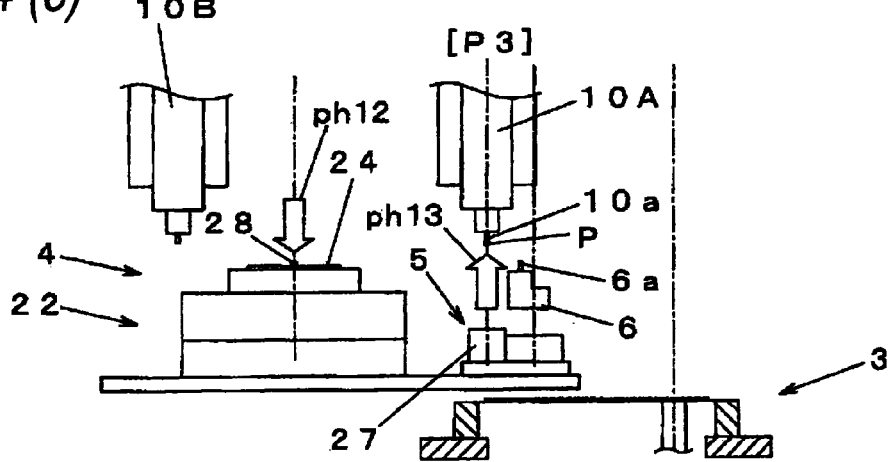
Figure 15:
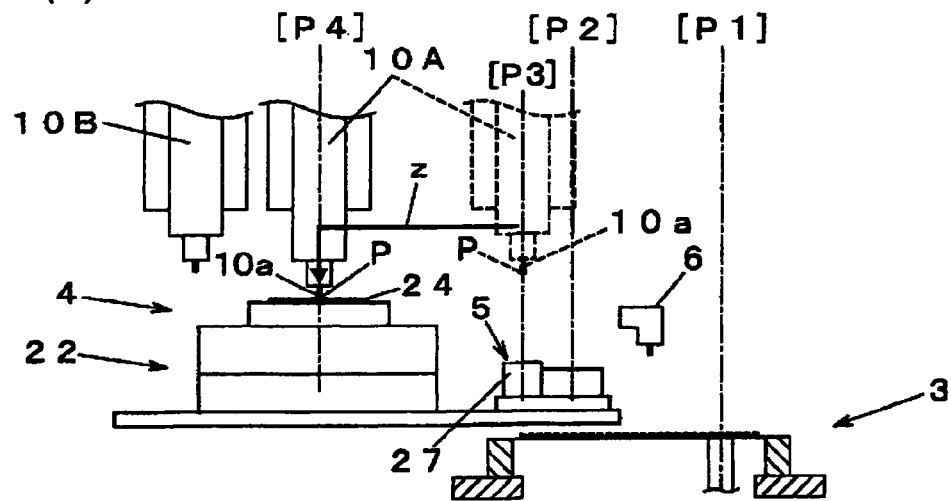
FIG. 15 is a process descriptive view of electronic component bonding operation of the electronic component bonder of the embodiment of the present invention.
Figure 15:
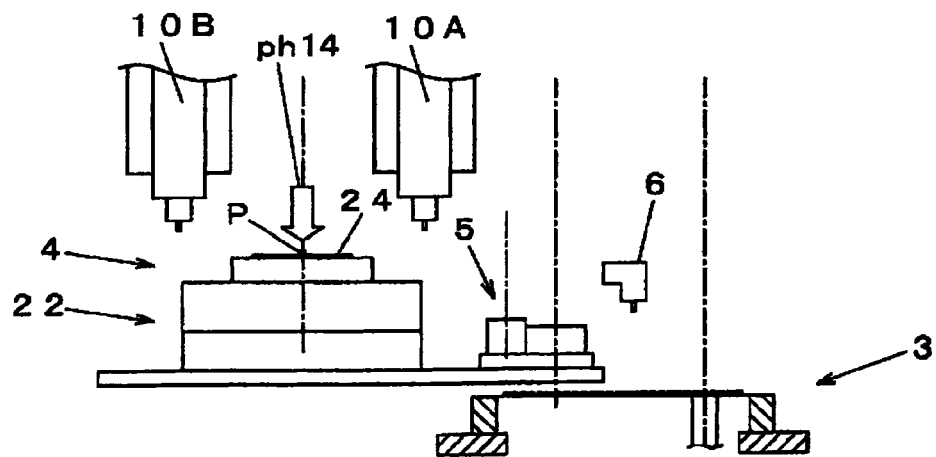
Figure 15:
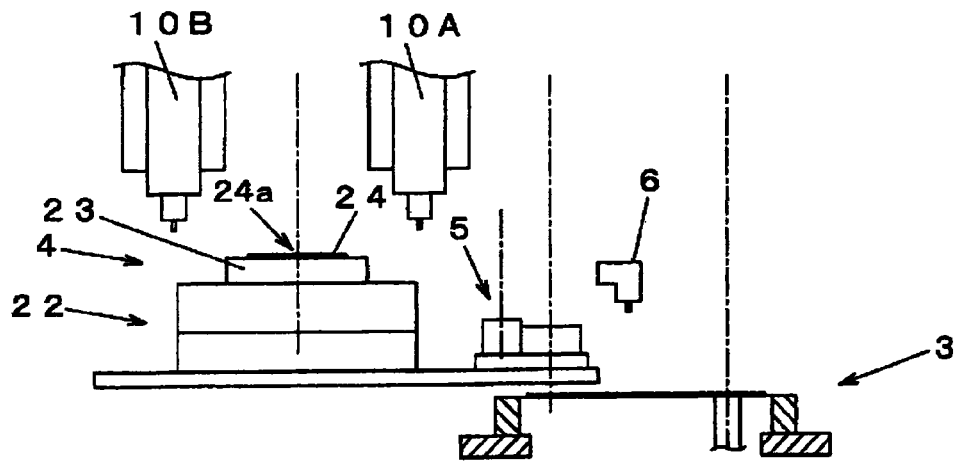
Figure 16:
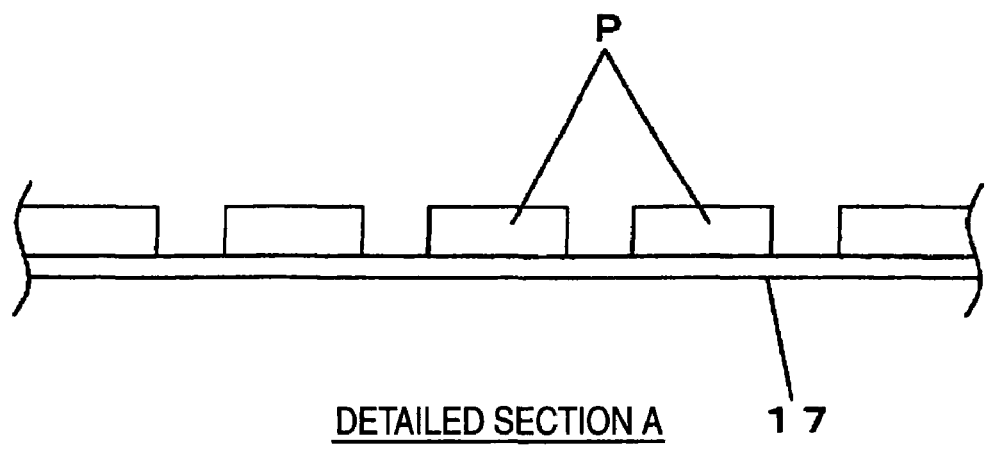
FIG. 16 is a detailed view of section A in FIG. 1.

An embodiment of the present invention will now be described by reference to the drawings. FIG. 1 is a front view of an electronic component bonder of an embodiment of the present invention; FIG. 2 is a side view of the electronic component bonder of the embodiment of the present invention; FIGS. 3, 4, and 5 are descriptive views of the structure of a pickup head and the structure of a pickup head moving mechanism in the electronic component bonder of the embodiment of the present invention; FIG. 6 is a block diagram showing the configuration of a control system of the electronic component bonder of the embodiment of the present invention; FIGS. 7, 8, and 9 are descriptive views of operation of a pickup head moving mechanism of the electronic component bonder of the embodiment of the present invention; FIGS. 10, 11, 12, 13, 14, and 15 are descriptive views of processes of electronic component bonding operation of the electronic component bonder of the embodiment of the present invention. FIG. 16 is a detailed view of section A in FIG. 1.

By reference to FIGS. 1 and 2, the overall structure of an electronic component bonder 1 will first be described. The electronic component bonder 1 has a function of bonding an electronic component, such as a semiconductor chip, taken out of an electronic component supply stage to a substrate positioned on a substrate positioning stage. In FIGS. 1 and 2, a base 2 assumes a rectangular shape when viewed from above, and an electronic component supply stage 3 and a substrate positioning stage 4 are arranged side by side on an upper surface of the base 2 in a direction Y (a first direction) when viewed from above.

The electronic component supply stage 3 has an XY table 11 including a Y-axis table 11Y and an X-axis table 11X that are stacked one on top of the other. A plurality of support members 13 are provided in upright positions on a horizontal movable plate 12 placed on an upper surface of the X-axis table 11X. The support members 13 support a holding table 14 constructed such that a wafer ring 15 is provided on an upper surface of the holding table and that an opening 14a is formed at the center of the holding table. A wafer sheet 17 is stretched across an upper edge of the wafer ring 15. As indicated by details of section A in the drawing, a plurality of electronic components P, which are split into pieces while their active faces are upwardly oriented, are adhesively held on the wafer sheet 17.

A pickup operation position [P1] for picking up an electronic component P from the wafer sheet 17 is set on the electronic component supply stage 3. An ejector mechanism 16 is positioned at a location in the holding table 14 corresponding to the pickup operation position [P1]. The ejector mechanism 16 has an ejector pin unit 16a having a function of promoting removal of the electronic component P from the wafer sheet 17 by pushing up the component from the underside of the wafer sheet 17 by means of a pin. The ejector pin unit 16a is caused to ascend or descend (as indicated by arrow "a") at the time of removal of the electronic components P, to thus contact the lower surface of the wafer sheet 17, so that a pickup head 6, which will be described later, can readily pull out the electronic components P from the wafer sheet 17.

During component removal operation, the XY table 11 is actuated, to thus horizontally move the wafer sheet 17 (as indicated by arrow "b"), whereby a desired electronic component P to be taken out, among the plurality of electronic components P mounted on the wafer sheet 17, is placed at the pickup operation position [P1]. An example using a wafer table that supplies an electronic component in the form of a wafer mounted on the wafer sheet 17 is herein provided as the electronic component supply stage 3. However, a component tray that supplies a plurality of electronic components in a predetermined planar arrangement can also be arranged on the electronic component supply stage 3 so as to be replaceable with the wafer table.

The substrate positioning stage 4 is set on an upper surface of a base plate 21 supported from below by a plurality of support posts 20 provided in upright positions on an upper surface of the base 2, and is constructed such that a substrate holding section 23 that holds a substrate 24 is placed on an XY table 22 built from an X-axis table 22x and a Y-axis table 22Y that are stacked one on top of the other. A bonding operation position [P4] for bonding the electronic component P to the substrate 24 held by the substrate holding section 23 is set on the substrate positioning stage 4. An arbitrary component mount point 24a set on the substrate 24 can be placed at the bonding operation position [P4] by actuating the XY table 22.

A intermediate stage 5 is interposed between the substrate positioning stage 4 and the electronic component supply stage 3 on the upper surface of the base plate 21. The intermediate stage 5 is constructed such that a mount table 26, on which the electronic component P taken out of the electronic component supply stage 3 is to be placed for positional correction, and a component recognition camera 27 for capturing an image of the electronic component P from below to recognize the component are arranged on an upper surface of an X-axis moving table 25. The X-axis moving table 25 is actuated, whereby the mount table 26 and the component recognition camera 27 are moved in a direction X within the horizontal plane. A relay position [P2] is set on the mount table 26, and a component recognition position [P3] is set on the component recognition camera 27. The mount table 26 and the component recognition camera 27 are moved by the X-axis moving table 25, thereby making it possible to position the electronic component P mounted on the mount table 26 to the relay position [P2] and position the component recognition camera 27 to the component recognition position [P3].

As shown in FIG. 2, a gantry 8 whose both ends are held from below by legs 8a is arranged at an edge of the base 2 in the direction X (the second direction) orthogonal to the direction Y and along the edge in the direction Y. The gantry 8 has a beam member 8b serving as a horizontal portion whose lower surface 8c is positioned at a location higher than the substrate positioning stage 4 and the electronic component supply stage 3 and horizontally extends in the direction Y. The gantry 8 is positioned in such a way that a front face 8d of the beam member 8 is oriented toward the center of the base 2 (see a center position indicated by an arrow B in FIG. 2); namely, a location where the electronic component supply stage 3 and the substrate positioning stage 4 are arranged. The front face 8d of the beam member 8b means a functional face of the beam member 8b; namely, a face on which a work head such as a bonding head 10A, is to be attached.

The pickup head 6 having a pickup nozzle 6a for sucking and holding the electronic component P is placed at a position above the electronic component supply stage 3. A pickup head moving mechanism 7 suspended from a lower surface 8c is provided beneath the beam member 8b. The pickup head moving mechanism 7 has a function of causing the pickup head 6 to advance or recede in the direction X as well as a function of moving the pickup head 6 between a location above the electronic component supply stage 3 and a location above the intermediate stage 5. The pickup head 6 thereby performs operation for picking up the electronic component P from the electronic component supply stage 3 and transferring the component to the mount table 26 of the intermediate stage 5. The pickup head 6 can be caused to recede in the direction X from a position above the pickup operation position [P1] when necessary.

A bonding head 10A and a coating head 10B are placed on the front face 8d of the beam member 8b by way of a head moving mechanism 9. The bonding head 10A holds the electronic component P on the electronic component supply stage 3 (or the electronic component P transferred to a position on the mount table 26 of the intermediate stage 5 from the electronic component supply stage 3 by the pickup head 6) and is bonded to the substrate 24 positioned on the substrate positioning stage 4. The coating head 10B coats the component mount point 24a set on the substrate 24 with an adhesive for bonding purpose prior to bonding operation performed by the bonding head 10A.

The head moving mechanism 9 (a bonding head moving mechanism) is arranged in front of the beam member 8b of the portal frame 8 along the direction Y. The head moving mechanism moves the bonding head 10A between a position above the electronic component supply stage 3 or the intermediate stage 5 and a position above the substrate positioning stage 4 and causes the coating head 10B to advance or recede above the substrate positioning stage 4 in the direction Y. The head moving mechanism 9 has a linear table 30 provided on the front face 8d of the beam member 8b in the direction Y across the entire length of the beam member 8b and moving blocks 35A and 35B that move in the direction Y relatively to the linear table 30. The bonding head 10A is mounted on the moving block 35A, and the coating head 10B is mounted on the moving block 35B. The bonding head 10A and the coating head 10B are vertically movable by means of built-in elevation mechanisms of the moving blocks 35A and 35B (as indicated by arrow "c").

Two guide rails 31 are laid in the direction Y on a front face of the linear table 30, and sliders 32 slidably fitted to the respective guide rails 31 are coupled to the moving blocks 35A and 35B, whereby the moving blocks 35A and 35B are slidable in the direction Y with respect to the linear table 30 (as indicated by arrow "d"). A moving member 34 is provided at a location on the back of the moving blocks 35A and 35B facing a stationary member 33 provided in front of the linear table 30 and over the entire range of the beam member 8b. The stationary member 33 and the moving member 34 built up a linear motor, thereby making it possible to position the bonding head 10A and the coating head 10B to an arbitrary position.

A first camera 36, a second camera 37, and a third camera 38 are placed at respective positions above the pickup operation position [P1], the relay position [P2], and the bonding operation position [P4] while imaging faces of the respective cameras are downwardly oriented. The first camera 36 captures an image of the electronic component P held by the wafer sheet 17 at the pickup operation position [P1] above the electronic component supply stage 3. An imaging result is subjected to recognition processing, whereby the position of the electronic component P affixed to the wafer sheet 17 is recognized. The XY table 11 is controlled on the basis of a recognition result, whereby the electronic component P to be taken out can be correctly placed at the pickup operation position [P1].

Likewise, the second camera 37 captures an image of the electronic component P placed on the mount table 26 at the relay position [P2] on the intermediate stage 5. An imaging result is subjected to recognition processing, whereby the position of the electronic components P affixed to the mount table 26 is recognized. The X-axis moving table 25 is controlled in accordance with a recognition result, whereby the electronic component P to be taken out can be correctly placed at the relay position [P2]. The third camera 38 captures an image of the component mount point 24a on the substrate 24 held by the substrate holding section 23 at the bonding operation position [P4] on the substrate positioning stage 4. An imaging result is subjected to recognition processing, whereby the location of the component mount point 24a is recognized. The XY table 22 is controlled in accordance with a recognition result, so that the component mount point 24a can be correctly aligned to the bonding operation position [P4].

In relation to the constructions of the respective sections, the pickup head moving mechanism 7 is constructed so as to be joined while being suspended from the lower surface 8c of the beam member 8b of the gantry 8. As shown in FIG. 2, a space S that allows entry of a part of the electronic component supply stage 3 is thereby assured at a position beneath the pickup head moving mechanism 7. When the electronic component P is taken out of the entire are of the wafer sheet 17 stretched across the wafer ring 15, it is necessary to place the electronic component P to be taken out at the pickup operation position [P1] by horizontally moving the hold table 14 by means of the XY table 11. For this reason, a free space commensurate with a horizontal movement stroke of the holding table 14 is required around the electronic component supply stage 3. In the electronic component bonder 1 provided in the present embodiment, the space S is assured at a position beneath the pickup head moving mechanism 7 as mentioned above, so that a horizontal movement stroke of the holding table 14 is assured as a result of entry of the holding table 14 into the space S, thereby enabling a reduction in facility's footprint.

By reference to FIGS. 3, 4, and 5, the detailed structure of the pickup head moving mechanism 7 is now described. With a view toward minimizing facility's footprint as mentioned above, the electronic component bonder 1 provided in the embodiment adopts a construction in which a mechanism serving as a drive source, such as a motor and a feed screw mechanism, among the mechanism elements making up the pickup head moving mechanism 7 is located beneath the beam member 8b and in which only an operation transmission mechanism for transmitting moving operation originating from the drive source to the pickup head 6 by way of the head moving member 42 is caused to protrude from the beam member 8b toward the center of the base 2.

Specifically, as shown in FIGS. 4 and 5, the pickup head 6 with the pickup nozzle 6a is linked to a reverse driving section 41 by way of a reverse spindle member 40, and the reverse driving section 41 is linked to a coupling plate 42a provided so as to protrude from the head moving member 42 in the direction X. Moving actions in directions of three axes; namely, the direction X (the second direction), the direction Y (the first direction), and the direction Z (the vertical direction), are transmitted from the drive source placed beneath the beam member 8b to the head moving member 42, thereby causing the pickup head 6 to perform predetermined working action. In short, in connection with the construction, the head moving member 42 has a function of causing the pickup head 6 to move in the first direction, the second direction, and the vertical direction.

The pickup head 6 has a built-in θ-axis mechanism 6b that rotates the pickup nozzle 6a around the axis and can align the electronic component P held by the pickup nozzle 6a to a direction θ. The pickup head 6 rotates around the reverse spindle member 40 that is a horizontal spindle by driving the reverse driving section 41, whereby the pickup head 6 is freely rotatable in a reverse direction. The electronic component P held by the pickup nozzle 6a can be reversed inside out by reverse rotation of the pickup head 6, and the front or back of the electronic component P can be changed in accordance with a bonding mode; in other words, the pickup head 6 is attached to the head moving member 42 by way of the reverse driving section 41 and freely, reversely rotatable around a horizontal axis in the direction X.

The Y-axis drive mechanism 50 transmits movement in the direction Y to the head moving member 42, and the Z-axis drive mechanism 60 transmits vertical movement in the direction Z to the head moving member 42. The X-axis drive mechanism 70 suspended from the lower surface 8c of the beam member 8b integrally moves the Y-axis drive mechanism 50 and the Z-axis drive mechanism 60 in the direction X. The structure of the Y-axis drive mechanism 50 is described. As shown in FIGS. 3 and 4, brackets 51a and 51b are provided on a lower surface of a connection plate 51 that is a horizontal, rectangular plate so as to downwardly extend while planes of the brackets are aligned to an XZ plane. A Y-axis motor 57 is attached to a side surface of the bracket 51a, and a feed screw 56 is axially supported in parallel with the Y-axis motor 57 by the brackets 51a and 51b. A pulley 58A is fitted to a rotary spindle of the feed screw 56, and a pulley 58B is fitted to a rotary spindle of the Y-axis motor 57. A belt 59 is passed around the pulleys 58A and 58B. A nut 55 screw-engaged with the feed screw 56 is joined to the Y-axis moving member 54. The Y-axis moving member 54 horizontally moves in the direction Y by driving the Y-axis motor 57 (as indicated by arrow "f").

A guide rail 52 is laid in direction Y along one edge of the lower surface of the connection plate 51. A slider 53 slidably fitted to the guide rail 52 in the direction Y is connected to a branch plate 54d that is bifurcated and horizontally extends from the Y-axis moving member 54 in the direction Y Movement of the Y-axis moving member 54 in the direction Y is guided by a Y guide mechanism made up of the guide rail 52 and the slider 53.

As shown in FIG. 4, one end of the Y-axis moving member 54 is bent at right angles in the direction Y, to thus make a Y bent 54a. An edge of the Y bent 54a is again bent at right angles in the direction X, to thus make an X bent 54b extending forwardly. The X bent 54b assumes a shape that is wider than the Y bent 54a in the direction Z, and two guide rails 54c are laid on a side face of the X bent 54b in the direction Z. A slider 46 fixed to a Y bent 42c, which extends from an edge of the head moving member 42 and is bent in the direction Y, is fitted to the guide rails 54C so as to be slidable in the direction Z. Movement of the Y-axis moving member 54 in the direction Y is transmitted to the head moving member 42 by way of the X bent 54b and the Y bent 42c. The guide rails 54c and the slider 46 are slidable in the direction Z at this time, whereby relative movements of the Y-axis moving member 54 and the head moving member 42 in the direction Z are permitted.

Therefore, the Y-axis moving member 54 acts as a first direction moving member that is driven by the Y-axis drive mechanism 50 serving as a first direction drive mechanism, to thus move in the direction Y (the first direction), and is connected to the head moving member 42 while being permitted to perform relative movement in the direction Z (the vertical direction). The X bent 54b, the guide rails 54c, the Y bent 42c, and the slider 46 make up a Y-axis connection section 45 that connects together the Y-axis moving member 54 and the head moving member 42 while permitting their relative movements in the direction Z.

The structure of the Z-axis drive mechanism 60 will now be described. As shown in FIGS. 3 and 4, a rectangular Z-axis plate 61 is connected to one end of the connection plate 51 in the direction Y while planes of the Z-axis plate are aligned to the XZ plane. Brackets 61a and 61b are attached respectively to upper and lower edges of the Z-axis plate 61 so as to extend in the direction Y A Z-axis motor 67 is attached in a vertical position to a lower surface of the bracket 61a, and a feed screw 66 arranged in parallel with a Z-axis motor 67 is axially supported by the brackets 61a and 61b. A pulley 68A is attached to a rotary spindle of the feed screw 66, and a pulley 68B is attached to a rotary spindle of the Z-axis motor 67. A belt 69 is passed around the pulleys 68A and 68B.

A nut 65 screw-engaged with the feed screw 66 is coupled to a connection member 64a extending in the direction Y from a Z-axis moving member 64, and the Z-axis moving member 64 is moved in the direction Z by driving the Z-axis motor 67 (as indicated by arrow "g"). Guide rails 62 are laid in the direction Z on a side surface of the Z-axis plate 61 facing the feed screw 66. A slider 63 fitted to the guide rails 62 so as to be slidable in the direction Z is coupled to the side surface of the Z-axis plate 61. Movement of the Z-axis moving member 64 in the direction Z is guided by a Z guide mechanism made up of the guide rails 62 and the slider 63.

As shown in FIG. 4, one end of the Z-axis moving member 64 extending in the direction X is bent at right angles in the direction Y, to thus form a Y bent 64b. The slider 44 is coupled to a side surface of the Y bent 64b while sliding direction of the slider is aligned to the direction Y A guide rail 43 on an extended portion 42b that is provided on top of the head moving member 42 so as to extend in the direction Y is fitted to the slider 44 so as to be slidable in the direction Y Movement of the Z-axis moving member 64 in the direction Z is transmitted to the head moving member 42 by way of the Y bent 64b and the extended portion 42b. The guide rail 43 and the slider 44 are slidable in the direction Y, thereby permitting relative movements of the Z-axis moving member 64 and the head moving member 42 in the direction Y.

Therefore, the Z-axis moving member 64 acts as a vertical moving member that is driven by the Z-axis drive mechanism 60 serving as the first direction drive mechanism, to thus move in the direction Z (the vertical direction), and that is coupled to the head moving member 42 while being permitted to perform relative movement in the direction Y (the first direction). The Y bent 64b, the slider 44, the extended portion 42b, and the guide rail 43 make up a Z-axis connecting section 47 that connects together the Z-axis moving member 64 and the head moving member 42 while permitting their relative movements in the direction Y.

The structure of the X-axis drive mechanism 70 is now described. As shown in FIGS. 3 and 5, rectangular brackets 71A and 71B are provided on the lower surface 8c of the beam member 8b so as to downwardly protrude while planes of the brackets are aligned to a YZ plane (see arrow C-C shown in FIG. 5). An X-axis motor 77 is attached in a horizontal position to a side surface of the bracket 71A, and a feed screw 76 arranged in parallel with the X-axis motor 77 is axially supported by the brackets 71A and 71B. A pulley 78A is attached to a rotary spindle of the feed screw 76, and a pulley 78B is attached to a rotary spindle of the X-axis motor 77. A belt 79 is passed around the pulleys 78A and 78B.

A nut 75 screw-engaged with the feed screw 76 is coupled to an upper surface of the connection plate 51 by way of a block 74. The X-axis motor 77 is driven, to thus rotate the feed screw 76, whereby the connection plate 51 is horizontally moved in the direction X (as indicated by arrow "h"). As mentioned previously, the Y-axis drive mechanism 50 and the Z-axis drive mechanism 60 are coupled to the connection plate 51. Both the Y-axis drive mechanism 50 and the Z-axis drive mechanism 60 are moved in the direction X by moving the connection plate 51 in the direction X. Therefore, in the foregoing construction, the connection plate 51 acts as a drive section connection member to which the Z-axis drive mechanism 60 serving as a vertical drive mechanism and the Y-axis drive mechanism 50 serving as a first direction drive mechanism are coupled.

A guide rail 72 is laid on the lower surface 8c of the beam member 8b in the direction X, and a slider 73 fitted to the guide rail 72 so as to be slidable in the direction X is joined to an upper surface of the connection plate 51 (see a view through D-D in FIG. 5). Movement of the connection plate 51 in the direction X is guided by an X guide mechanism made up of the guide rail 72 suspended from the lower surface 8c of the beam member 8b and the slider 73. Specifically, the X-axis drive mechanism 70 acts as a second direction drive mechanism that is coupled to the lower surface 8c of the beam member 8b in a suspended manner and that moves the connection plate 51 serving as a drive section connection member in the direction X (the second direction).

In the above construction, the head moving member 42 that moves in the directions X, Y, and Z in conjunction with the pickup head 6 is constructed so as to be coupled to the Y-axis moving member 54 by way of the Y-axis connection section 45 and to the Z-axis moving member 64 by way of the Z-axis connection section 47. As a result, a stationary drive section 7a made up of the Y-axis drive mechanism 50, the Z-axis drive mechanism 60, and the X-axis drive mechanism 70 can be placed at a position where the stationary drive section does not horizontally protrude out of the lower surface 8c of the beam member 8b. Specifically, as a result of adoption of the construction in which only a movable operation transmission section 7b made up of the head moving member 42, the Y-axis moving member 54, the Z-axis moving member 64, the Y-axis connection section 45, and the Z-axis connection section 47 is caused to protrude from the lower surface 8c of the beam member 8b, a drive mechanism of the pickup head 6 can be constructed compact.

The construction of a control system of the electronic component bonder 1 is now described by reference to FIG. 6. A control section 80 is a processing computing device and controls operations and processing of respective sections to be described blow by use of programs and data stored in a storage section 81. Specifically, the control section 80 controls operations of the XY table 11 of the electronic component supply stage 3, the ejector mechanism 16, the XY table 22 of the substrate positioning stage 4, the substrate holding section 23, the X-axis moving table 25 of the intermediate stage 5, the built-in θ-axis rotary mechanism 6b of the pickup head 6, the reverse driving section 41 that reverses the pickup head 6 upside down, and the X-axis drive mechanism 70, the Y-axis drive mechanism 50, and the Z-axis drive mechanism 60 of the pickup head moving mechanism 7. Moreover, the control section 80 controls operations of the bonding head 10A, the coating head 10B, and the head moving mechanism 9 that horizontally moves the bonding head 10A and the coating head 10B.

The storage section 81 stores operation-processing programs for controlling the respective section and work data for carrying out operation for bonding an electronic component. An operation-input section 82 is an input device, such as a keyboard and a mouse, and performs entry of an operation command and various types of data for operating the respective sections of the electronic component bonder 1. A display section 83 is a display device, such as a liquid-crystal panel; and displays a guide screen and an information screen appearing during input operation performed by means of the operation-input section 82, a screen captured by a camera, and the like. A recognition processing section 84 recognizes and processes results captured by the component recognition camera 27, the first camera 36, the second camera 37, and the third camera 38.

In accordance with a recognition result acquired by capturing an image of the electronic component P held by the bonding head 10A by means of the component recognition camera 27, the control section 80 controls the XY table 22 and the head moving mechanism 9, whereby positional displacement, which would occur when the electronic component P is bonded to the substrate 24, is corrected. In accordance with a recognition result acquired by means of the first camera 36 capturing an image of the electronic component P affixed to the wafer sheet 7, the control section 80 controls the XY table 11, whereby the electronic component P to be taken out can be correctly positioned at the pickup operation position [P1]. In accordance with a recognition result acquired by means of the second camera 37 capturing an image of electronic component P placed on the mount table 26 of the intermediate stage 5, the control section 80 controls the X-axis moving table 25 and the head moving mechanism 9, whereby the electronic component P can be held on the bonding head 10A while positional displacement of the electronic component P mounted on the mount table 26 is corrected.

A result yielded as a result of the third camera 38 capturing an image of the substrate 24 is subjected to recognition processing, whereby processing below is performed. In accordance with a recognition result yielded by capturing an image of the substrate 24 and detecting the component mount point 24a set on the substrate 24, the control section 80 controls the XY table 22, whereby the component mount point 24a, which is a bonding target, can be correctly aligned to the bonding operation position [P3]. Imaging results of the substrate 24 which has been coated with an adhesive and to which the electronic components have been bonded are subjected to recognition processing, whereby inspection for determining whether a coated state of the adhesive is detective or nondefective and inspection for determining whether bonded state of the electronic components is good or bad are performed. The inspection processing is not inevitable and performed as required.

Moving operation of the pickup head 6 implemented by the pickup head moving mechanism 7 will now be described. Moving operation in the direction Y is first described by reference to FIGS. 7A and 7B. FIG. 7A shows a state in which the nut 55 is situated at the rightmost position on the feed screw 56 in the Y-axis drive mechanism 50. In this state, the pickup head 6 is situated at the right end of the Y-direction stroke. A vertical position of the pickup head 6 is regulated at this time by a vertical position of the Z-axis moving member 64 in the Z-axis drive mechanism 60. The Y-axis motor 57 is driven in this state by a predetermined amount, whereby the nut 55 is moved to the leftmost position on the feed screw 56 as shown in FIG. 7B. The head moving member 42 is thereby moved leftwards by way of the Y-axis moving member 54 and the Y-axis connection section 45 (as indicated by arrow "K"), whereby the pickup head 6 is moved by only a predetermined Y stroke Sy. The guide rail 43 is slid in the direction Y along the slider 44 making up the Z-axis connection section 47, whereby the head moving member 42 can be moved in the direction Y regardless of the state of the Z-axis drive mechanism 60.

By reference to FIGS. 8A and 8B, example operation including a combination of moving operation in the direction Y with moving operation in the direction Z is now described. FIG. 8A shows a state in which the nut 55 of the Y-axis drive mechanism 50 is situated at the rightmost position on the feed screw 56 and in which the nut 65 is situated at the lowermost position on the feed screw 66 in the Z-axis drive mechanism 60. In this state, the pickup head 6 is situated at a right end of a Y-direction stroke and at a lower end of a Z-direction stroke.

The Y-axis motor 57 and the Z-axis motor 67 are driven by only predetermined amounts in this state, whereby the nut 55 is moved to the leftmost position on the feed screw 56 (as indicated by arrow "i") as shown in FIG. 8B, and the nut 65 is elevated to a predetermined position commensurate with the amount of rotation of the Z-axis motor 67 by the feed screw 66 (as indicated by arrow "j"). Upper, leftward moving operation is transmitted to the head moving member 42 by way of the Y-axis moving member 54, the Y-axis connection section 45, the Z-axis moving member 64, and the Z-axis connection section 47, whereby the pickup head 6 is moved by only the predetermined Y stroke Sy and the Z stroke Sz.

FIG. 9 shows advancing and receding operations of the pickup head 6 performed as a result of the X-axis drive mechanism 70 being driven. As mentioned previously, the electronic component P to be bonded by the electronic component bonder 1 is taken out of the electronic component supply stage 3 at the pickup operation position [P1]. The type of a head used for taking out the electronic component P changes according to whether or not the removed electronic component P must be placed on the mount table 26 of the intermediate stage 5. Namely, when the removed electronic component P must be placed on the mount table 26 and relayed, the pickup head 6 is situated at the pickup operation position [P1] and caused to perform pickup operation so as to ascend or descend with respect to the wafer sheet 17 of the electronic component supply stage 3 and place the removed electronic component P on the mount table 26.

In contrast to this, when the electronic component P is taken out of the electronic component supply stage 3 directly by means of the bonding head 10A, the pickup head 6 is caused to recede from the pickup operation position [P1] toward the edge of the base 2 as shown in FIG. 9. Namely, the X-axis drive mechanism 70 of the pickup head moving mechanism 7 is driven, to thus move the pickup head 6 in the direction X along with the operation transmission section 7b shown in FIG. 5 (as indicated by arrow "I"). A free space where ascending and descending actions of the bonding head 10A are not susceptible to interference is thereby assured at the pickup operation position [P1], and the bonding head 10A can directly take out the electronic component P from the wafer sheet 17 of the electronic component supply stage 3.

The electronic component bonder 1 is constructed as mentioned above, and electronic component bonding operation performed by the electronic component bonder 1 is now described hereinbelow. First, example working operation for transferring the electronic component P in a face-up position taken out of the electronic component supply stage 3 to the substrate positioning stage 4 by way of the intermediate stage 5 and bonding the component is described by reference to FIGS. 10A, 10B, 10C, 11A, 11B, and 11C. The working operation is selected when the electronic component P to be taken as an object is a type of component requiring bonding of high positional accuracy.

In FIG. 10A, the wafer sheet 17 to which a plurality of electronic components P in face-up positions are affixed is set on the electronic component supply stage 3. The ejector pin unit 16a remains in contact with a lower surface of the wafer sheet 17 at the pickup operation position [P1], and pickup operation is feasible. In the substrate position stage 4, the substrate 24 that is an object of bonding is held by the substrate holding section 23 provided on the XY table 22.

When electronic component bonding operation is initiated, the first camera 36 first captures an image of the wafer sheet 17 at the pickup operation position [P1], thereby recognizing the electronic component P to be taken (as indicated by arrow ph1). The XY table 11 of the electronic component supply stage 3 is controlled in accordance with a recognition result, whereby the electronic component P to be taken is correctly positioned at the pickup operation position [P1]. In parallel with the positioning operation, the third camera 38 captures an image of the substrate 24 at the bonding operation position [P4] (as indicated by arrow ph2), thereby recognizing the component mount point 24a to be bonded. The XY table 22 of the substrate positioning stage 4 is controlled in accordance with a recognition result, whereby the component mount point 24a is correctly positioned at the bonding operation position [P4].

As shown in FIG. 10B, the pickup head 6 is moved to the pickup operation position [P1] in the electronic component supply stage 3 and lowered with respect to the wafer sheet 17 (as indicated by arrow "m"). The pickup nozzle 6a holds the electronic component P to be taken out and removes the component from the wafer sheet 17. Subsequently, the pickup head 6 whose pickup nozzle 6a holds the electronic component P moves to the intermediate stage 5 and places the electronic component P on the mount table 26 (as indicated by arrow "n"). In the substrate positioning stage 4, the coating head 10B moves to the bonding operation position [P4] and descends with respect to the substrate 24 (as indicated by arrow "o"), whereby a coating nozzle 10b is caused to approach the component mount point 24a of the substrate 24, to thus perform coating operation.

As shown in FIG. 10C, an adhesive 28 for use in bonding an electronic component is applied to the component mount point 24a of the substrate 24, and the coating head 10B is subsequently moved to a standby position (as indicated by arrow "p"). In the intermediate stage 5 from which the pickup head 6 has left, the second camera 37 captures an image of the electronic component P on the mount table 26 (as indicated by arrow ph3), thereby recognizing the mounted electronic component P and detecting positional displacement. In accordance with the recognition result, the X-axis moving table 25 of the intermediate stage 5 is controlled, whereby the mounted electronic component P is correctly positioned at the relay position [P2]. The X-axis moving table 25 performs positional correction in only the X direction, and positional correction in the direction Y is performed when the bonding head 10A holds the electronic component P. In parallel with the positional correction, the third camera 38 captures an image of the substrate 24 at the bonding operation position [P4] (as indicated by arrow ph4), whereby inspection for determining whether or not the state of the substrate 24 coated with the adhesive 28 is nondefective is performed. Inspection of the coated state is not indispensable and may also be omitted.

As shown in FIG. 11A, the bonding head 10A is moved to the intermediate stage 5 and lowered with respect to the electronic component P mounted on the mount table 26, and the bonding nozzle 10a holds the electronic component P (as indicated by arrow "q"). Subsequently, the bonding head 10A holding the electronic component P is moved to a position above the substrate positioning stage 4, and the bonding head 10A is lowered at the bonding operation position [P4], whereby the held electronic component P is bonded to the substrate 24 (as indicated by arrow "r").

As shown in FIG. 11B, when the bonding head 10A completed bonding operation has receded from the bonding operation position [P4], the third camera 38 captures an image of the substrate 24 (as indicated by arrow ph5), thereby recognizing the bonded electronic component P and performing inspection of a bonded state in accordance with a recognition result. Inspection of a bonded state is not indispensable and may also be omitted. Subsequently, as shown in FIG. 11C, there is performed component positioning operation for positioning the electronic component P to be next taken out to the pickup operation position [P1] in the electronic component supply stage 3. In a substrate positioning stage 4, there is performed substrate positioning operation for aligning the next component mount point 24a of the substrate 24 to the component recognition position [P3]. Subsequently, processing returns to the process shown in FIG. 10A, where similar working operation is repeatedly performed.

By reference to FIGS. 12A, 12B, 12C, 13A, 13B, and 13C, there is described example working operation for transferring the electronic component P in a face-up position taken out of the electronic component supply stage 3 by the bonding head 10A directly to the substrate positioning stage 4 without passing through the intermediate stage 5 and bonding the component. In FIG. 12A, the wafer sheet 17 to which a plurality of electronic components P in face-up positions are pasted is set in the electronic component supply stage 3. The ejector pin unit 16a comes into contact with the lower surface of the wafer sheet 17 at the pickup operation position [P1], and pickup operation is feasible. In the substrate positioning stage 4, the substrate 24 to be bonded is held by the substrate holding section 23 provided on the XY table 22.

When electronic component bonding operation is initiated, the first camera 36, to begin with, captures an image of the wafer sheet 17 at the pickup operation position [P1], thereby recognizing the electronic component P to be taken (as indicated by arrow ph6). The XY table 11 of the electronic component supply stage 3 is controlled in accordance with a recognition result, whereby the electronic component P to be taken out is correctly positioned at the pickup operation position [P1]. In parallel with the positioning operation, the third camera 38 captures an image of the substrate 24 at the component recognition position [P3] (as indicated by arrow ph7), thereby recognizing the component mount point 24a that is a bonding target. The XY table 22 of the substrate positioning stage 4 is thus controlled in accordance with the recognition result, whereby the component mount point 24a is properly positioned at the bonding operation position [P4].

As shown in FIG. 12B, the bonding head 10A is moved to a position above the electronic component supply stage 3 and positioned at the pickup operation position [P1]. Next, the bonding head 10A is lowered with respect to the wafer sheet 17 (as indicated by arrow "s"), and the electronic component P to be taken is held by the bonding nozzle 10a, thereby removing the electronic component from the wafer sheet 17. In the substrate positioning stage 4, the coating head 10B is moved to the bonding operation position [P4] and lowered with respect to the substrate 24 (as indicated by arrow "t"), whereby the coating nozzle 10b is caused to approach the component mount point 24a of the substrate 24 and perform coating operation. As shown in FIG. 12C, the adhesive 28 for electronic component bonding purpose is applied to the component mount point 24a of the substrate 24, as shown in FIG. 12C, and the coating head 10B subsequently moves to the standby position. The bonding head 10A whose bonding nozzle 10a holds the electronic component P moves toward a position above the substrate positioning stage 4 from the pickup operation position [P1] (as indicated by arrow "u"). In parallel with the movement, the third camera 38 captures an image of the substrate 24 at the bonding operation position [P4] (as indicated by arrow ph8), and inspection for determining whether or not the state of the substrate 24 coated with the adhesive 28 is good is performed. Inspection of a coated state is not indispensable and may also be omitted.

Next, as shown in FIG. 13A, the bonding head 10A is positioned at the bonding operation position [P4] and lowered, thereby the thus-held electronic component P is bonded to the substrate 24 (as indicated by arrow "v"). As shown in FIG. 13B, when the bonding head 10A completed bonding operation has receded from the bonding operation position [P4], the third camera 38 captures an image of the substrate 24 (as indicated by arrow ph9), thereby recognizing the bonded electronic component P. Inspection of a bonded state is performed in accordance with a recognition result. Inspection of a bonded state is not indispensable and may also be omitted.

As shown in FIG. 13C, in the electronic component supply stage 3, there is performed component positioning operation for positioning the electronic component P to be next taken out is positioned at the pickup operation position [P1]. In the substrate positioning stage 4, there is performed substrate positioning operation for aligning the next component mount point 24a of the substrate 24 to the component recognition position [P3]. Subsequently, processing turning back to the process shown in FIG. 12A, where similar working operation is repetitively performed.

By reference to FIGS. 14 and 15, there is described example working operation for reversing upside down the electronic component P in a face-up position, which has been taken out of the electronic component supply stage 3 by the bonding head 10A, to a face-down position and subsequently transferring the component to the substrate positioning stage 4, where the component is bonded. In FIG. 14A, the wafer sheet 17 to which a plurality of electronic components P in face-up positions are affixed is set in the electronic component supply stage 3. The ejector pin unit 16a remains in contact with the lower surface of the wafer sheet 17 at the pickup operation position [P1]. In the substrate positioning stage 4, the substrate 24 to be bonded is held by the substrate holding section 23 provided on the XY table 22.

When electronic component bonding operation is initiated, the first camera 36, to begin with, captures an image of the wafer sheet 17 at the pickup operation position [P1] (as indicated by arrow ph10), thereby recognizing the electronic component P to be taken out. The XY table 11 of the electronic component supply stage 3 is controlled in accordance with a recognition result, whereby the electronic component P to be taken out is correctly positioned at the pickup operation position [P1]. In parallel with positioning operation, the third camera 38 captures an image of the substrate 24 at the bonding operation position [P4] (as indicated by arrow ph11), thereby recognizing the component mount point 24a that is a bonding target. In accordance with a recognition result, the XY table 22 of the substrate positioning stage 4 is controlled, thereby correctly positioning the component mount point 24a at the bonding operation position [P4].

As shown in FIG. 14B, the pickup head 6 is moved to a position above the electronic component supply stage 3 and positioned at the pickup operation position [P1] and then lowered with respect to the wafer sheet 17 (as indicated by arrow "w"). The pickup nozzle 6a holds the electronic component P to be taken out, thereby removing the component from the wafer sheet 17. Subsequently, the pickup head 6 moves to a position above the intermediate stage 5 while holding the electronic component P (as indicated by arrow "x") and activates at that position the reverse drive section 41 (see FIGS. 3 and 4), thereby rotating the pickup head 6 through 180 degrees.

The pickup nozzle 6a holding the electronic component P is thereby upwardly oriented, and the electronic component P assumes a face-down position at which an active face of the component is downwardly oriented. In the substrate positioning stage 4, the coating head 10B moves to the bonding operation position [P4] and is lowered with respect to the substrate 24 (as indicated by arrow "y"), and the coating nozzle 10b is caused to approach the component mount point 24a of the substrate 24 and to perform coating operation.

As shown in FIG. 14C, the adhesive 28 for electronic component bonding purpose is applied to the component mount point 24a of the substrate 24, and the coating head 10B subsequently moves to a standby position. The bonding head 10A moves to a location above the intermediate stage 5 and is situated at a point immediately above the pickup head 6. Next, the bonding head is lowered with respect to the pickup head 6, whereby the bonding nozzle 10a receives the electronic component P in a face-down position held by the pickup nozzle 6a.

Next, the bonding head 10A whose bonding nozzle 10a holds the electronic component P moves to the component recognition position [P3], where the component recognition camera 27 captures an image of the electronic component P held by the bonding nozzle 10a (as indicated by arrow ph13), thereby recognizing positional displacement of the electronic component P held by the bonding head 10A. In parallel with the recognition operation, the third camera 38 captures an image of the substrate 24 at the bonding operation position [P4] (as indicated by arrow ph12), thereby performing inspection for determining whether or not the state of the substrate 24 coated with the adhesive 28 is good. Inspection of a coated state is not indispensable and may also be omitted.

Next, as shown in FIG. 15A, the bonding head 10A is positioned at the bonding operation position [P4] and lowered, thereby the thus-held electronic component P is bonded to the substrate 24 (as indicated by arrow "z"). The positional displacement detected by the component recognition camera 27 shown in FIG. 14C through component recognition is corrected. As shown in FIG. 15B, when the bonding head 10A completed bonding operation has receded from the bonding operation position [P4], the third camera 38 captures an image of the substrate 24 (as indicated by arrow ph14), thereby recognizing the bonded electronic component P. Inspection of a bonded state is performed in accordance with a recognition result. Inspection of a bonded state is not indispensable and may also be omitted.

As shown in FIG. 14C, in the electronic component supply stage 3, there is performed component positioning operation for positioning the electronic component P to be next taken out at the pickup operation position [P1]. In the substrate positioning stage 4, there is performed substrate positioning operation for aligning the next component mount point 24a of the substrate 24 to the bonding operation position [P4]. Subsequently, processing turning back to the process shown in FIG. 14A, where similar working operation is repetitively performed.

As described above, the electronic component bonder 1 described in connection with the embodiment has a construction in which the intermediate stage 5 is interposed between the substrate positioning stage 4 and the electronic component supply stage 3; and in which it is possible to select either a mode of the bonding head 10A transferring to the substrate positioning stage 4 the electronic component P taken out of the electronic component supply stage 3 by the pickup head 6 and mounted on the intermediate stage 5 or a mode for transporting the electronic component P, which has been taken directly out of the electronic component supply stage 3, to the substrate positioning stage 4 by means of the bonding head 10A. In the construction, the pickup head moving mechanism 7 for moving the pickup head 6 is coupled in a suspended manner to the lower surface of the beam member 8b of the gantry 8 positioned at the end of the base 2, and a space S that allows entry of a portion of the electronic component supply stage 3 is assured at a position beneath the pickup head moving mechanism 7. Moreover, the reverse drive section 41 for inverting the pickup head 6 upside down is provided, whereby the electronic component P supplied in a face-up position while its active face is upwardly oriented can be inverted to a face-down position and bonded to the substrate 24. A range of component types that can be taken as objects to be produced is enlarged, to thus enhance versatility, and by decreasing facility's footprint area productivity can be increased.

The electronic component bonder of the present invention has a characteristic of enabling enhancement of versatility and area productivity, and can be applied to a field where an electronic component is bonded to a lead-frame, a resin substrate, and the like.

What is claimed is:

1. An electronic component bonder that bonds an electronic component taken out of an electronic component supply stage to a substrate positioned on a substrate positioning stage, the bonder comprising:
    a base on which the substrate positioning stage and the electronic component supply stage are arranged side by side in a first direction when viewed from above;
    a gantry that is arranged at an edge of the base and that has a horizontal portion whose lower surface is situated at a position higher than the substrate positioning stage and the electronic component supply stage, that extends in the first direction, wherein the gantry is arranged in such a way that a front face of the horizontal portion is oriented toward a center of the base;
    a intermediate stage that is interposed between the substrate positioning stage and the electronic component supply stage and on which the electronic component taken out of the electronic component supply stage is to be mounted;
    a pickup head that picks up the electronic component from the electronic component supply stage and transfers the component to the intermediate stage;
    a pickup head moving mechanism that moves the pickup head between a position above the electronic component supply stage and a position above the intermediate stage and that causes the pickup head to advance or recede in a second direction orthogonal to the first direction;
    a bonding head that holds the electronic component on the electronic component supply stage or the electronic component transferred to the intermediate stage by the pickup head and that bonds the electronic component to the substrate positioned on the substrate positioning stage; and
    a bonding head moving mechanism that is arranged on the front face of the horizontal portion of the gantry along the first direction and that moves the bonding head between a position above the electronic component supply stage or the intermediate stage and a position above the substrate positioning stage,
    wherein the pickup head moving mechanism is joined, in a suspended manner, to the lower surface of the horizontal portion' of the gantry, and a space that allows entry of a portion of the electronic component supply stage is assured at a position beneath the pickup head moving mechanism.

2. The electronic component bonder according to claim 1, wherein the pickup head moving mechanism has
    a head moving member that moves the pickup head in the first direction, the second direction, and a vertical direction;
    a vertical moving member that is driven by a vertical direction drive mechanism, to thus vertically move, and that is joined to the head moving member while being permitted to perform relative movement in the first direction;
    a first direction moving member that is driven by a first direction drive mechanism, to thus move in the first direction and that is joined to the head moving member while being permitted to perform relative movement in the vertical direction;
    a drive section connection member to which the vertical direction drive mechanism and the first direction drive mechanism are connected; and
    a second direction drive mechanism that is joined to the lower surface of the horizontal portion in a suspended manner and that moves the drive section connection member in the second direction.

3. The electronic component bonder according to claim 2, wherein the pickup head is attached to the head moving member by way of a reverse drive mechanism and reversible around a horizontal axis in the second direction.

4. The electronic component bonder according to claim 2, wherein the first direction drive mechanism, the second direction drive mechanism, and a vertical moving-drive mechanism are arranged at positions where the mechanisms do not horizontally protrude out of the lower surface of the horizontal portion.

* * * * *